United States Patent
Chiu

(10) Patent No.: US 12,374,581 B2
(45) Date of Patent: *Jul. 29, 2025

(54) METHOD FOR MANUFACTURING SEMICONDUCTOR STACK STRUCTURE WITH ULTRA THIN DIE

(71) Applicant: Nexthin Technology, George Town (KY)

(72) Inventor: Tzu-wei Chiu, Zhubei (TW)

(73) Assignee: Nexthin Technology, George Town (KY)

( * ) Notice: Subject to any disclaimer, the term of this patent is extended or adjusted under 35 U.S.C. 154(b) by 0 days.

This patent is subject to a terminal disclaimer.

(21) Appl. No.: 18/893,967

(22) Filed: Sep. 24, 2024

(65) Prior Publication Data

US 2025/0014942 A1 Jan. 9, 2025

Related U.S. Application Data

(63) Continuation of application No. 18/561,734, filed as application No. PCT/CN2021/094503 on May 19, 2021.

(51) Int. Cl.
| | |
|---|---|
| *H01L 21/02* | (2006.01) |
| *H01L 21/304* | (2006.01) |
| *H01L 21/762* | (2006.01) |
| *H01L 21/768* | (2006.01) |

(52) U.S. Cl.
CPC .. *H01L 21/76251* (2013.01); *H01L 21/02164* (2013.01); *H01L 21/304* (2013.01); *H01L 21/76898* (2013.01)

(58) Field of Classification Search
None
See application file for complete search history.

(56) References Cited

U.S. PATENT DOCUMENTS 6,169,000 B1 * 1/2001 Ohkubo ............ H01L 21/76251
438/270

FOREIGN PATENT DOCUMENTS

| JP | 2011-138825 | * | 7/2011 |
| WO | WO 2009/107883 | * | 3/2009 |

* cited by examiner

*Primary Examiner* — Asok K Sarkar

(57) ABSTRACT

A method includes manufacturing a plurality of wafers each having a substrate having an active surface and a backside, and a stop layer dividing the substrate into a first substrate part at a side of the active surface and a second substrate part at a side of the backside; on a first wafer of the plurality of wafers, removing the second substrate part and the stop layer; bonding a second wafer of the plurality of wafers on the first wafer with first substrate part of the second wafer facing a surface of the first wafer that is exposed by removing the stop layer and, on the second wafer, performing the same processes of removing the second substrate part and stop layer of the second wafer; repeating the bonding and removing the second substrate part and stop layer with one or more wafers to form a stack of wafers.

25 Claims, 31 Drawing Sheets

METHOD FOR MANUFACTURING SEMICONDUCTOR STACK STRUCTURE WITH ULTRA THIN DIE

CROSS REFERENCE TO RELATED APPLICATIONS

This application is a continuation application of U.S. patent application Ser. No. 18/561,734 filed on Nov. 17, 2023, which is a National Phase Application of International Application No. PCT/CN2021/094503, filed on May 19, 2021. All of the above referenced applications are incorporated herein by reference.

FIELD OF THE INVENTION

The present disclosure relates to a method for manufacturing a semiconductor structure, and more particularly to a method for manufacturing a semiconductor stack structure with an ultra-thin die.

BACKGROUND OF THE INVENTION

With the vigorous development of the electronic industry, electronic products are gradually entering the research and development direction of multi-function and high performance, and semiconductor technology has been widely used in the manufacturing of memories, central processing units and other chipsets. In order to achieve high integration and high speed, the size of semiconductor integrated circuits is continuously reduced. At present, a variety of different materials and technologies have been developed to meet the above requirements for integration and high speed, and a stack structure including multiple substrates has also been developed to improve the operating speed of the circuits. When semiconductor planar packaging technology has reached its limit, the need for miniaturization may be met by integration. Wafer stacking is a great tool for the future of technology, and it is also a target that needs to be improved in the related art.

SUMMARY OF THE INVENTION

The present disclosure provides a method for manufacturing a semiconductor stack structure with an ultra-thin die. By means of the method, the semiconductor stack structure with the ultra-thin die may meet the requirements for high integration and high speed, and has better electrical characteristics and efficiency.

A method for manufacturing a semiconductor stack structure with an ultra-thin die according to the present disclosure includes: manufacturing a plurality of semiconductor wafers, and selecting one of the semiconductor wafers as a first semiconductor wafer at a bottom layer, and some other semiconductor wafers as a second semiconductor wafer and third semiconductor wafers to be stacked, each of the semiconductor wafers being manufactured by the following steps: providing a semiconductor substrate having an active surface and a backside that are opposite to each other; forming a stop layer structure in the semiconductor substrate to divide the semiconductor substrate into a first substrate part and a second substrate part, where the first substrate part is located between the stop layer structure and the active surface, the second substrate part is located between the stop layer structure and the backside, the stop layer structure at least includes a silicon nitride layer, and the silicon nitride layer is manufactured by carrying out a nitrogen ion implantation process at a first depth of the semiconductor substrate first and then carrying out a high temperature treatment process to form the silicon nitride layer in a nitrogen ion implanted region; providing a plurality of conductive structures in the first substrate between the active surface and the stop layer structure; providing, on the active surface, a plurality of electrical components and an inner connection layer including a plurality of interconnection points; and flipping the second semiconductor wafer with respect to the first semiconductor wafer, enabling the inner connection layer of the first semiconductor wafer and the inner connection layer of the second semiconductor wafer to be opposite to each other and bonded together by hybrid bonding; carrying out a first backside grinding process from the backside of the second semiconductor wafer to remove a portion of the second substrate part of the second semiconductor wafer; carrying out a first thinning process to form a thinned second semiconductor wafer; carrying out a second backside grinding process from the backside of the first semiconductor wafer to remove a portion of the second substrate part of the first semiconductor wafer; and carrying out a second thinning process to form a thinned first semiconductor wafer, where the first thinning process and the second thinning process include: a step of substrate removal for removing the remaining second substrate part to expose the stop layer structure; and a step of stop layer removal for removing the stop layer structure to expose the first substrate part and the conductive structures.

According to one embodiment of the present disclosure, before the second backside grinding process is carried out, a plurality of thinned third semiconductor wafers may be stacked on the thinned second semiconductor wafer in sequence, where each of the thinned third semiconductor wafers is stacked by the following steps: flipping the third semiconductor wafer with respect to the first semiconductor wafer, enabling the inner connection layer of the third semiconductor wafer to be opposite to and bonded with the first substrate part of the thinned second semiconductor wafer; carrying out a third backside grinding process from the backside of the third semiconductor wafer to remove a portion of the second substrate part of the third semiconductor wafer; and carrying out a third thinning process, including a step of substrate removal and a step of stop layer removal.

According to one embodiment of the present disclosure, the stop layer structure further includes a silicon dioxide layer, and the silicon dioxide layer is disposed on the silicon nitride layer and located between the silicon nitride layer and the active surface.

According to one embodiment of the present disclosure, the silicon dioxide layer is formed by the following steps: carrying out, after the nitrogen ion implantation process, an oxygen ion implantation process at a second depth of the semiconductor substrate first, the second depth being less than the first depth; and then carrying out the high temperature treatment process to form the silicon dioxide layer in an oxygen ion implanted region.

According to one embodiment of the present disclosure, the step of stop layer removal includes: removing the silicon nitride layer first and then removing the silicon dioxide layer.

According to one embodiment of the present disclosure, the step of substrate removal is selected from one of chemical mechanical polishing, wet etching or plasma dry etching, where a selection ratio of silicon to silicon nitride is 20-80.

According to one embodiment of the present disclosure, the silicon nitride layer and the silicon dioxide layer are removed by one of chemical mechanical polishing and plasma dry etching, where a selection ratio of silicon nitride to silicon dioxide is 10-20, and a selection ratio of silicon dioxide to silicon is about 5.

According to one embodiment of the present disclosure, a distance between the stop layer structure and the active surface is 1 micron-5 microns, and a thickness of the thinned second semiconductor wafer is not greater than 12 microns.

According to one embodiment of the present disclosure, after the thinned first semiconductor wafer is formed, the method further includes the following steps: providing a plurality of solder balls on a side, away from the thinned second semiconductor wafer, of the thinned first semiconductor wafer to be electrically connected to the conductive structures respectively; and carrying out an electrical test and die sawing.

A method for manufacturing a semiconductor stack structure with an ultra-thin die according to the present disclosure includes: manufacturing a plurality of semiconductor wafers, each of the semiconductor wafers being manufactured by the following steps: providing a semiconductor substrate having an active surface and a backside that are opposite to each other; forming a stop layer structure in the semiconductor substrate to divide the semiconductor substrate into a first substrate part and a second substrate part, where the first substrate part is located between the stop layer structure and the active surface, the second substrate part is located between the stop layer structure and the backside, the stop layer structure at least includes a silicon nitride layer, and the silicon nitride layer is manufactured by carrying out a nitrogen ion implantation process at a first depth of the semiconductor substrate first and then carrying out a high temperature treatment process to form the silicon nitride layer in a nitrogen ion implanted region; and providing a plurality of conductive structures in the first substrate part between the active surface and the stop layer structure; providing, on the active surface, a plurality of electrical components and an inner connection layer including a plurality of interconnection points; selecting one of the semiconductor wafers as a first semiconductor wafer as a bottom layer, and carrying out die sawing on part of the semiconductor wafers as a first batch of semiconductor chips and at least one second batch of semiconductor chips to be stacked; flipping the first batch of semiconductor chips with respect to the first semiconductor wafer, enabling the inner connection layers of the first batch of semiconductor chips and the inner connection layer of the first semiconductor wafer to be opposite to each other and bonded together by hybrid bonding; carrying out a first molding process to form a first molding compound on the first semiconductor wafer to cover the first batch of semiconductor chips; carrying out a first backside grinding process, removing part of the first molding compound from a side, away from the first semiconductor wafer, of the first molding compound, and removing a portion of the second substrate parts of the first batch of semiconductor chips; carrying out a first thinning process to form a first semiconductor chip layer; carrying out a second backside grinding process from the backside of the first semiconductor wafer to remove a portion of the second substrate part of the first semiconductor wafer; and carrying out a second thinning process to form a thinned first semiconductor wafer, where the first thinning process and the second thinning process include: a step of substrate removal for removing the remaining second substrate part to expose the stop layer structure; and a step of stop layer removal for removing the stop layer structure to expose the first substrate part and the conductive structures.

According to one embodiment of the present disclosure, before the second backside grinding process is carried out, at least one second semiconductor chip layer may be stacked on the first semiconductor chip layer in sequence, where each of the second semiconductor chip layers is stacked by the following steps: flipping the second batch of semiconductor chips with respect to the first semiconductor wafer, enabling the inner connection layers of the second batch of semiconductor chips to be opposite to and bonded with the first substrate part of the first semiconductor chip layer; carrying out a second molding process to form a second molding compound on the first semiconductor chip layer to cover the second batch of semiconductor chips; carrying out a third backside grinding process, removing part of the second molding compound from a side, away from the first semiconductor chip layer, of the second molding compound, and removing a portion of the second substrate parts of the second batch of semiconductor chips; and carrying out a third thinning process, including a step of substrate removal and a step of stop layer removal.

A method for manufacturing a semiconductor stack structure with an ultra-thin die according to the present disclosure includes: providing a bearing plate and forming a plurality of first conductive posts on the bearing plate; providing a plurality of semiconductor chips, each of the semiconductor chips being manufactured by the following steps: providing a semiconductor substrate having an active surface and a backside that are opposite to each other; forming a stop layer structure in the semiconductor substrate to divide the semiconductor substrate into a first substrate part and a second substrate part, where the first substrate part is located between the stop layer structure and the active surface, the second substrate part is located between the stop layer structure and the backside, the stop layer structure at least includes a silicon nitride layer, and the silicon nitride layer is manufactured by carrying out a nitrogen ion implantation process at a first depth of the semiconductor substrate first and then carrying out a high temperature treatment process to form the silicon nitride layer in a nitrogen ion implanted region; providing a plurality of conductive structures in the first substrate part between the active surface and the stop layer structure; providing, on the active surface, a plurality of electrical components and an inner connection layer including a plurality of interconnection points; carrying out die sawing to produce semiconductor chips; selecting a first batch of semiconductor chips and at least one second batch of semiconductor chips from the semiconductor chips, the first batch of semiconductor chips including a plurality of first semiconductor chips, the at least one second batch of semiconductor chips including a plurality of second semiconductor chips; flipping the first batch of semiconductor chips on the bearing plate, with the first conductive posts being disposed between the adjacent first semiconductor chips, the inner connection layers of the first batch of semiconductor chips being adjacent to the bearing plate, the semiconductor substrates of the first batch of semiconductor chips being away from the bearing plate; carrying out a first molding process to form a first molding compound on the bearing plate to cover the first batch of semiconductor chips and the first conductive posts; carrying out a first backside grinding process, removing part of the first molding compound from a side, away from the bearing plate, of the first molding compound, and removing a portion of the second substrate parts of the first batch of semiconductor chips; carrying out a first thinning process to form a first semiconductor chip layer, the first thinning process including: removing the remaining second substrate parts and the stop layer structures of the first batch of semiconductor chips in sequence to expose the first substrate parts, the conductive structures, and the first conductive posts; providing a plurality of second conductive posts to be electrically connected to part of the conductive structures of the first semiconductor chip layer; flipping the second batch of semiconductor chips on the first semiconductor chip layer, where the second semiconductor chips are respectively connected between the adjacent first semiconductor chips in a crossing manner, such that the inner connection layers of the second semiconductor chips are electrically connected to the exposed first conductive posts and part of the conductive structures of the first semiconductor chip layer, and part of the second conductive posts are disposed between the adjacent second semiconductor chips; carrying out a second molding process to form a second molding compound on the first semiconductor chip layer to cover the second batch of semiconductor chips and the second conductive posts; carrying out a second backside grinding process, removing part of the second molding compound from a side, away from the first semiconductor chip layer, of the second molding compound, and removing a portion of the second substrate parts of the second batch of semiconductor chips; carrying out a second thinning process to form a second semiconductor chip layer, the second thinning process including: removing the remaining second substrate parts and the stop layer structures of the second batch of semiconductor chips in sequence to expose the first substrate parts, the conductive structures, and the second conductive posts; and removing the bearing plate to expose the inner connection layers of the first semiconductor chip layer and the first conductive posts.

According to one embodiment of the present disclosure, after the bearing plate is removed, the method further includes the following steps: providing a plurality of solder balls on a side, away from the second semiconductor chip layer, of the first semiconductor chip layer to be electrically connected to the inner connection layers and the first conductive posts respectively; and carrying out die sawing.

According to one embodiment of the present disclosure, the first semiconductor chips of the first batch of semiconductor chips have different electrical functions.

According to one embodiment of the present disclosure, the second semiconductor chips of the second batch of semiconductor chips have different electrical functions.

According to the present disclosure, in the manufacturing process of the semiconductor wafer, the stop layer structure is formed in the semiconductor substrate by the ion implantation process, and then the electrical components and the inner connection layer are provided on the active surface of the semiconductor substrate; and then two semiconductor wafers are bonded up and down, or, after the semiconductor wafers are subjected to die sawing to form a plurality of semiconductor chips, the batch of semiconductor chips are combined with the semiconductor wafer at the bottom. Each time after bonding of semiconductor wafers/chips (and molding of the molding compound), part of the semiconductor substrate and the stop layer structure of the upper one of the semiconductor wafers/chips are removed from the backside of the upper one of the semiconductor wafers/chips through the backside grinding process and the thinning process, such that the upper one of the semiconductor wafers/chips forms a thinned semiconductor wafer/semiconductor chip layer; then bonding (and molding of the molding compound), backside grinding and thinning processes of the other one of the semiconductor wafers/chips are carried out one by one on the thinned semiconductor wafer/chip to stack another thinned semiconductor wafer upwards one by one; and finally, the backside grinding process and the thinning process are carried out on the semiconductor wafer at the bottom. Since the thickness of each thinned semiconductor wafer/semiconductor chip is not greater than 12 microns, under the limitation of a total chip thickness of 700 microns, 57 chip layers may be stacked, thereby meeting the requirements for high integration and high speed.

The above description is only an overview of the technical solutions of the present disclosure. In order to understand more clearly the technical means of the present disclosure, which may be implemented in accordance with the contents of the specification, and in order to make the above and other purposes, features and advantages of the present disclosure more clearly understood, preferred embodiments are given below and described in detail below in conjunction with the accompanying diagrams.

BRIEF DESCRIPTION OF THE DRAWINGS

FIG. 3A to FIG. 3L show schematic cross-sectional diagrams of a method for manufacturing a semiconductor stack structure with an ultra-thin die according to a third embodiment of the present disclosure.

DETAILED DESCRIPTION OF PREFERRED EMBODIMENTS

Figure 1A:
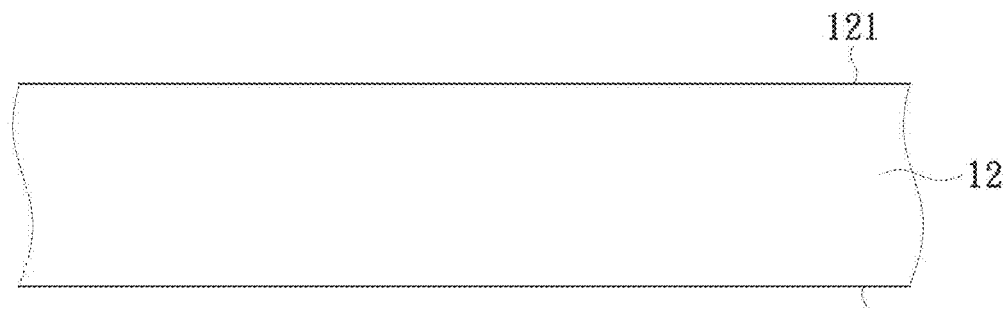
FIG. 1A to FIG. 1S show schematic cross-sectional diagrams of a method for manufacturing a semiconductor stack structure with an ultra-thin die according to a first embodiment of the present disclosure.
Figure 1B:
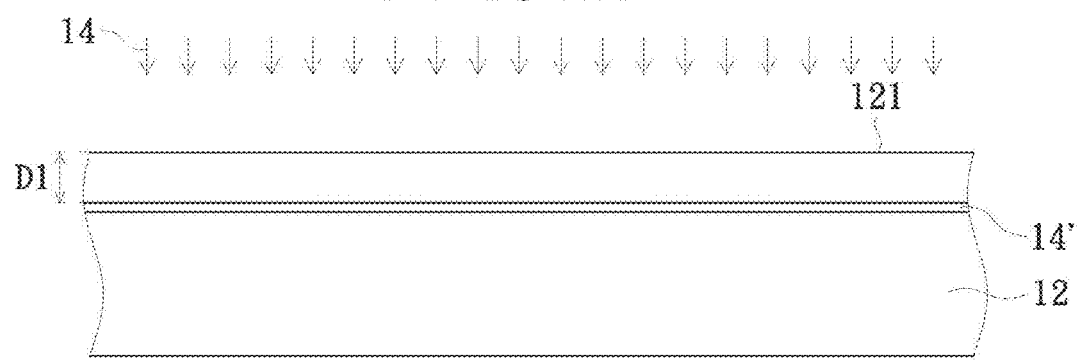
Figure 1C:
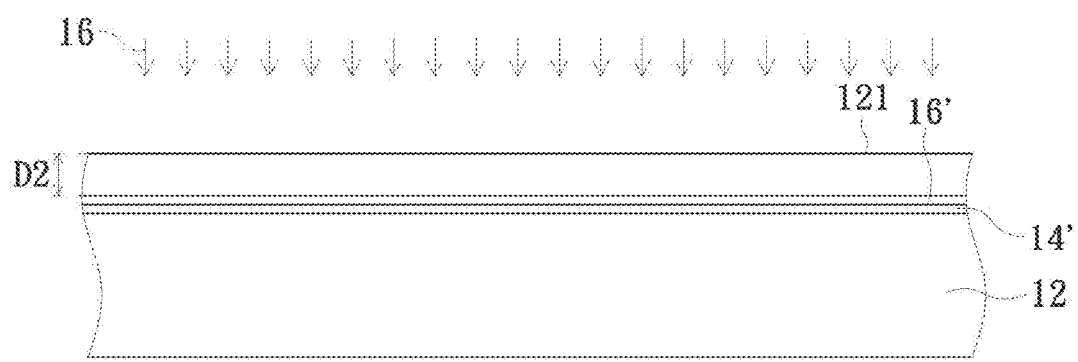
Figure 1D:
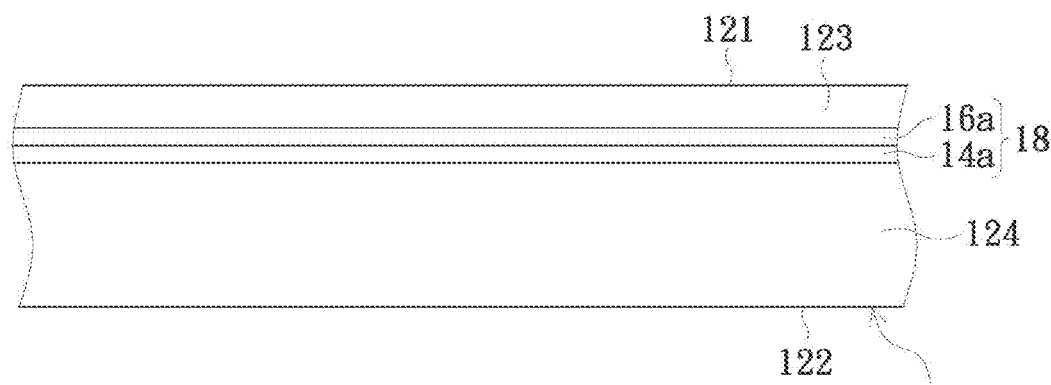
Figure 1E:
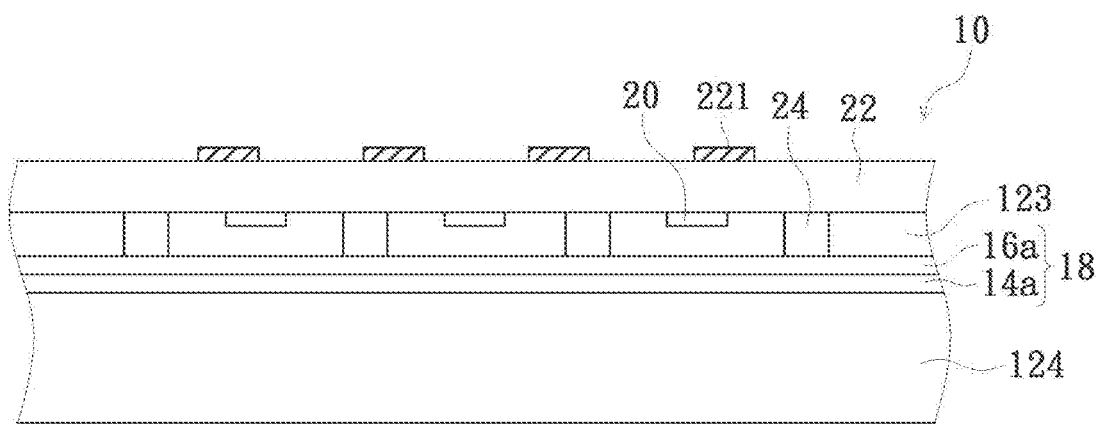
Figure 1F:
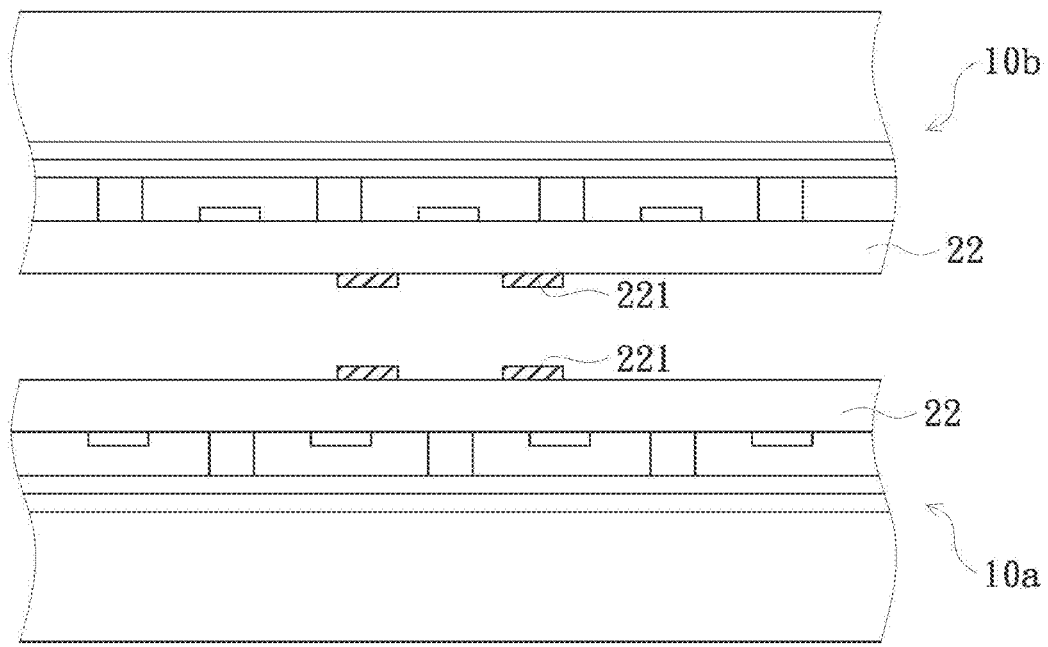
Figure 1G:
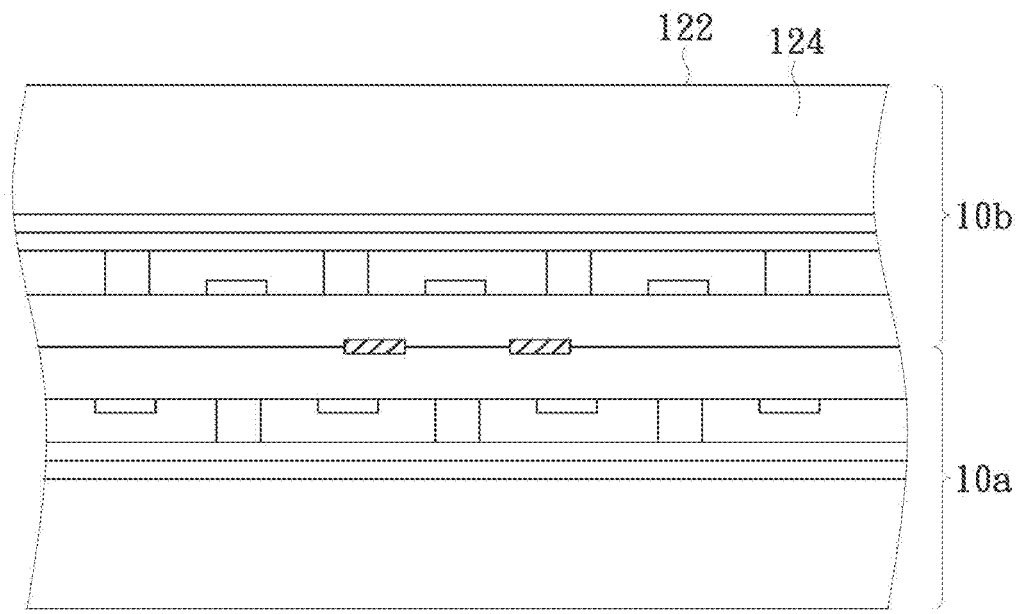
Figure 1H:
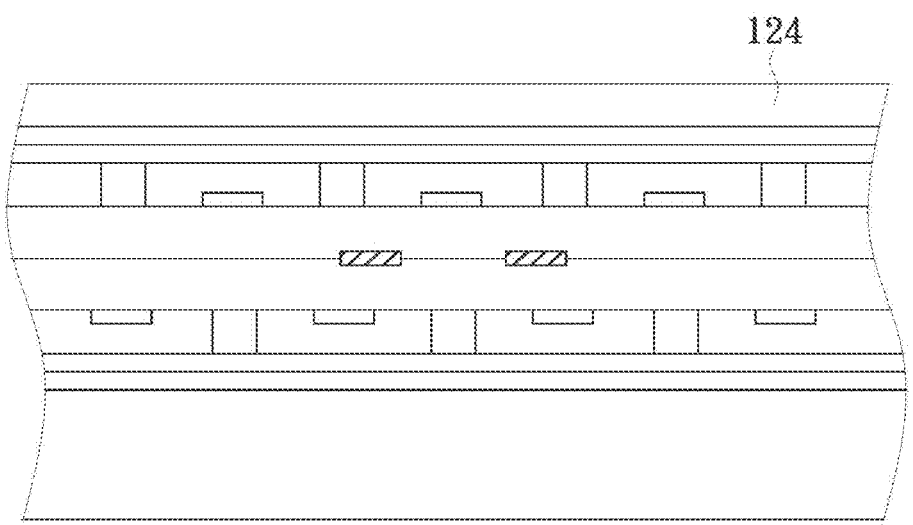
Figure 1I:
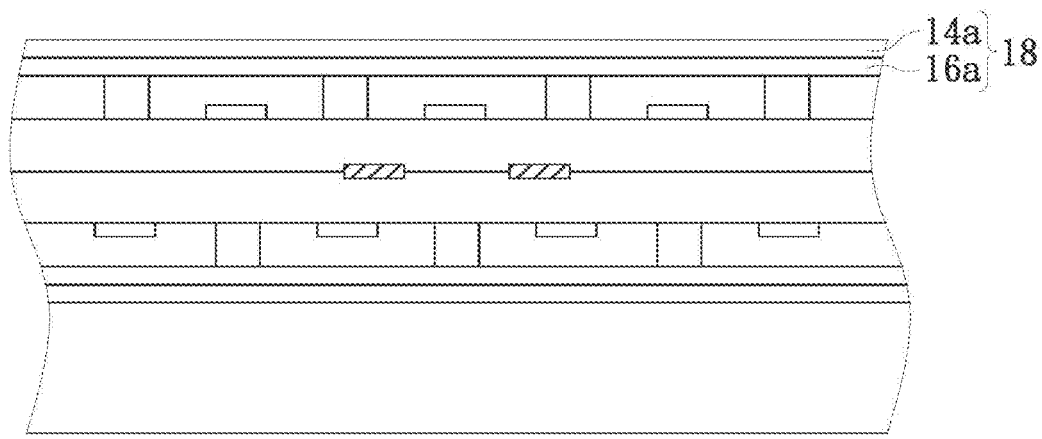
Figure 1J:
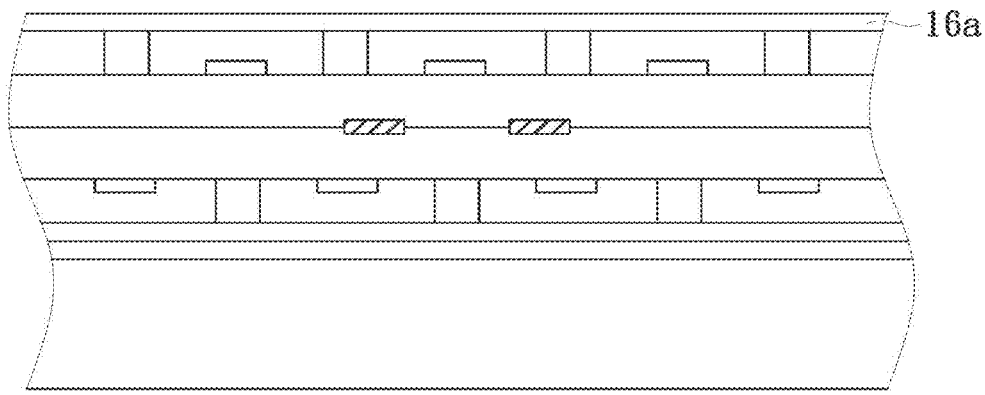
Figure 1K:
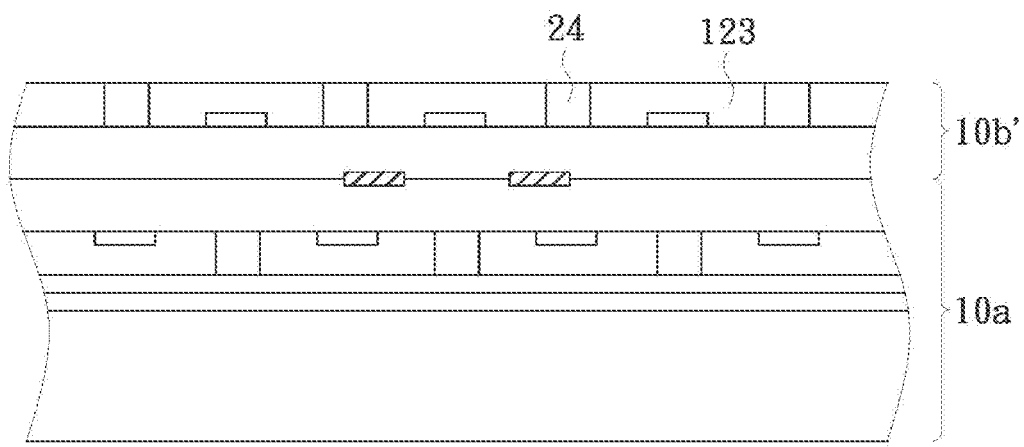
Figure 1L:
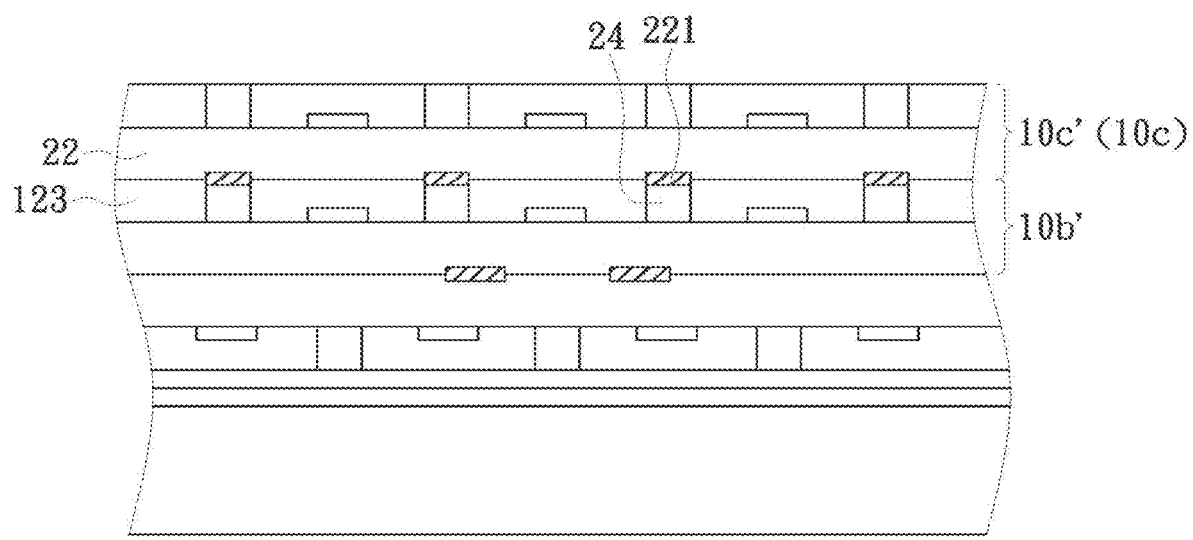
Figure 1M:
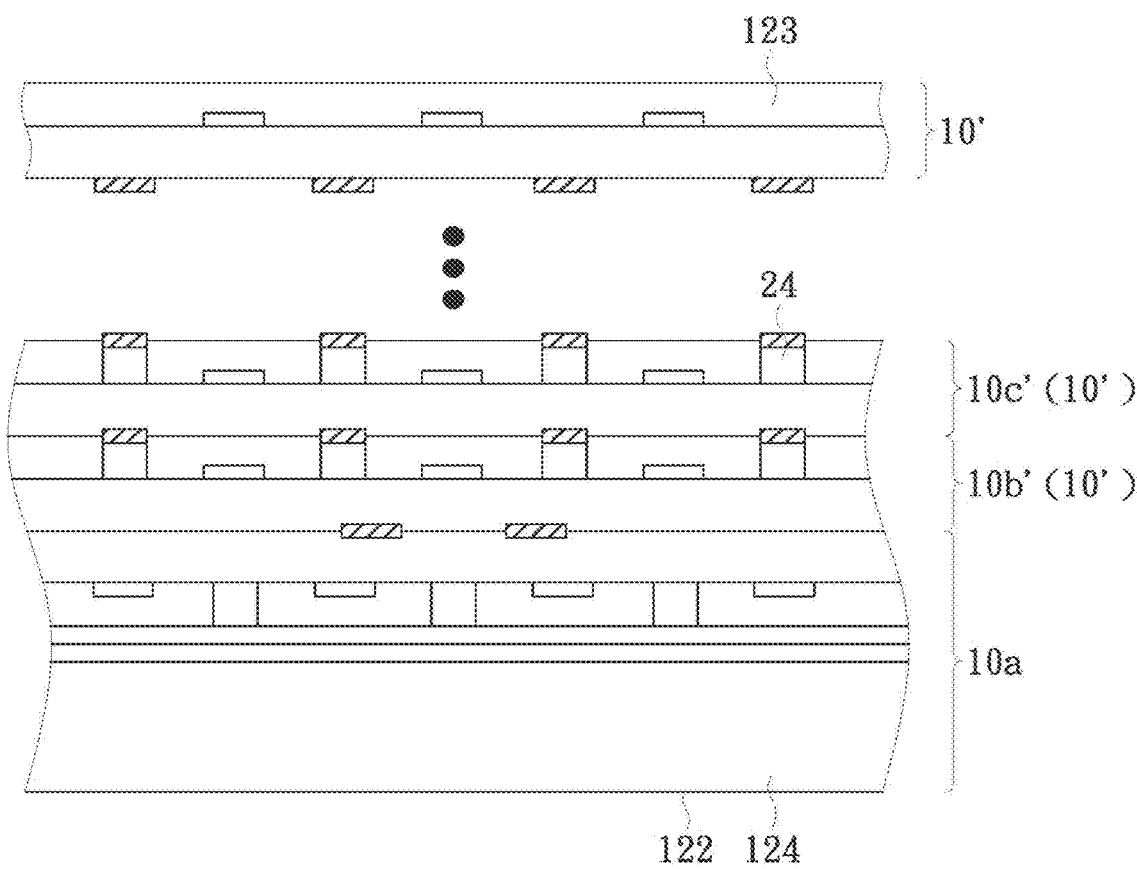
Figure 1N:
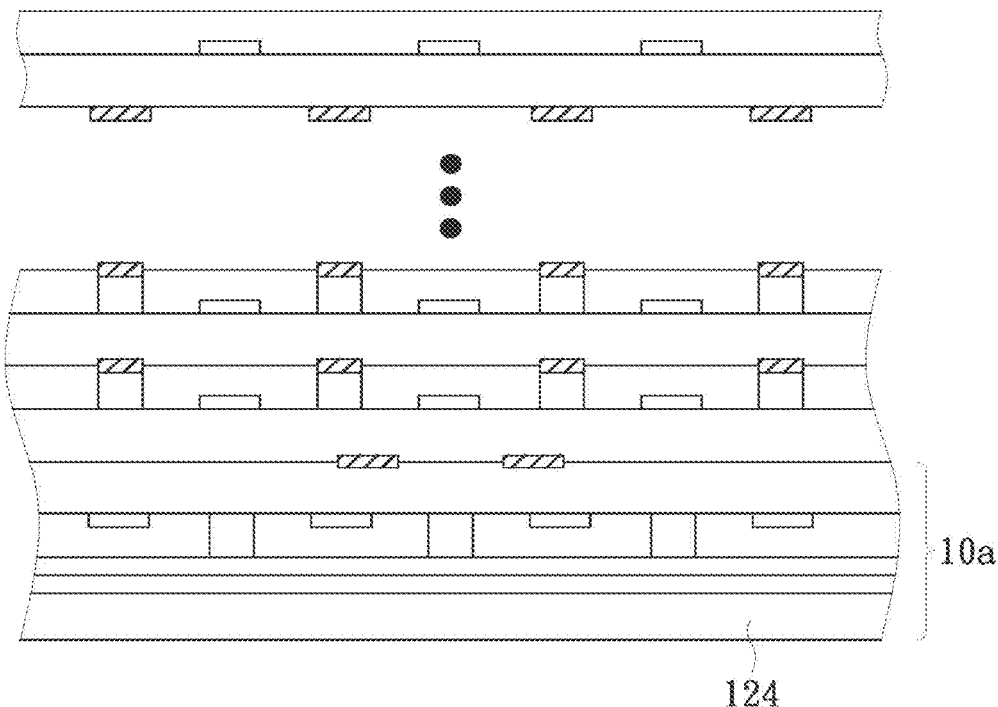
Figure 1O:
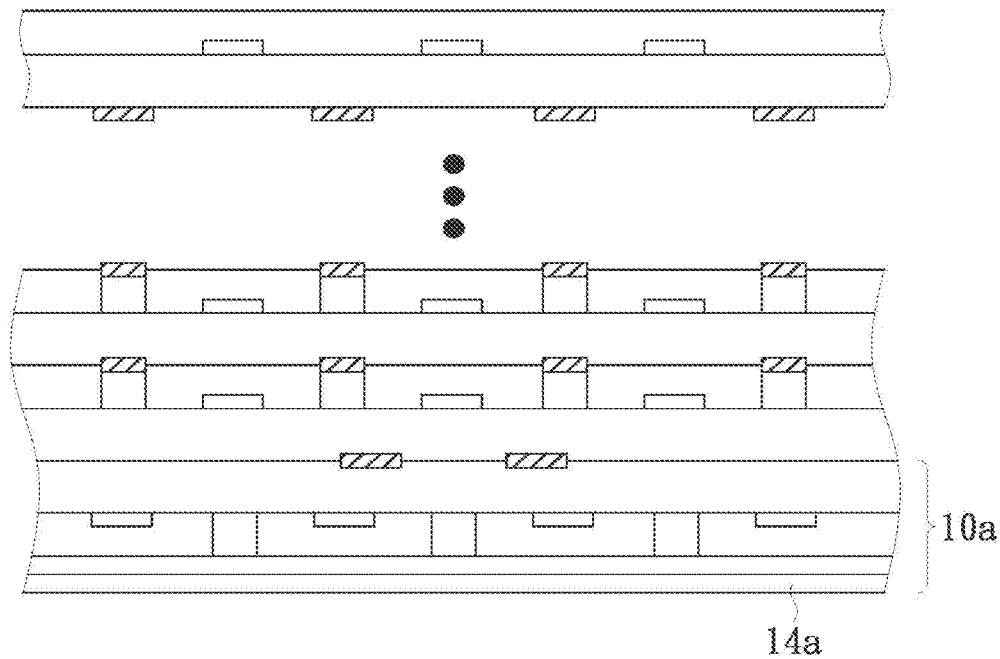
Figure 1P:
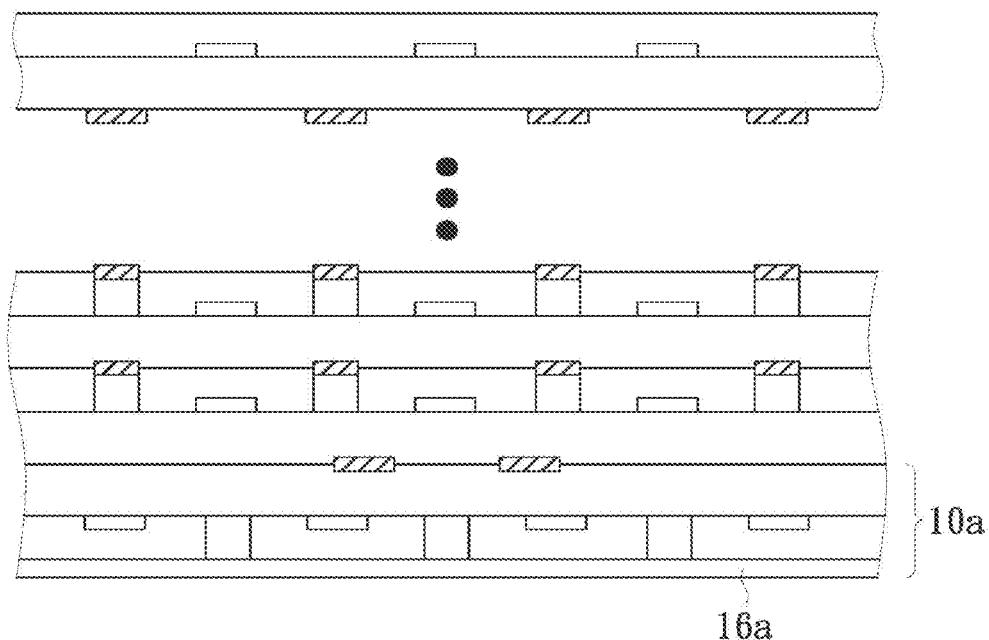
Figure 1Q:
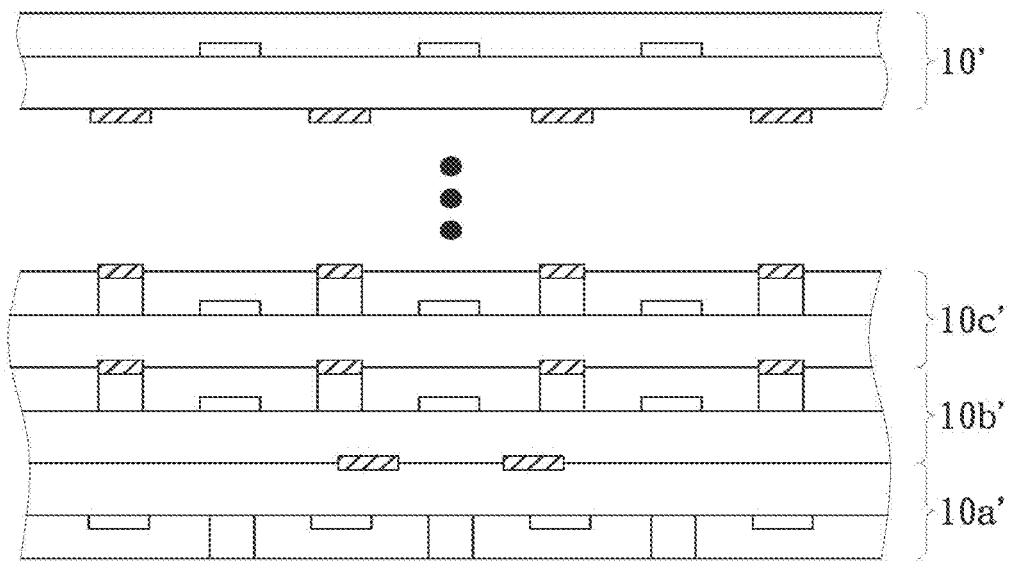
Figure 1R:
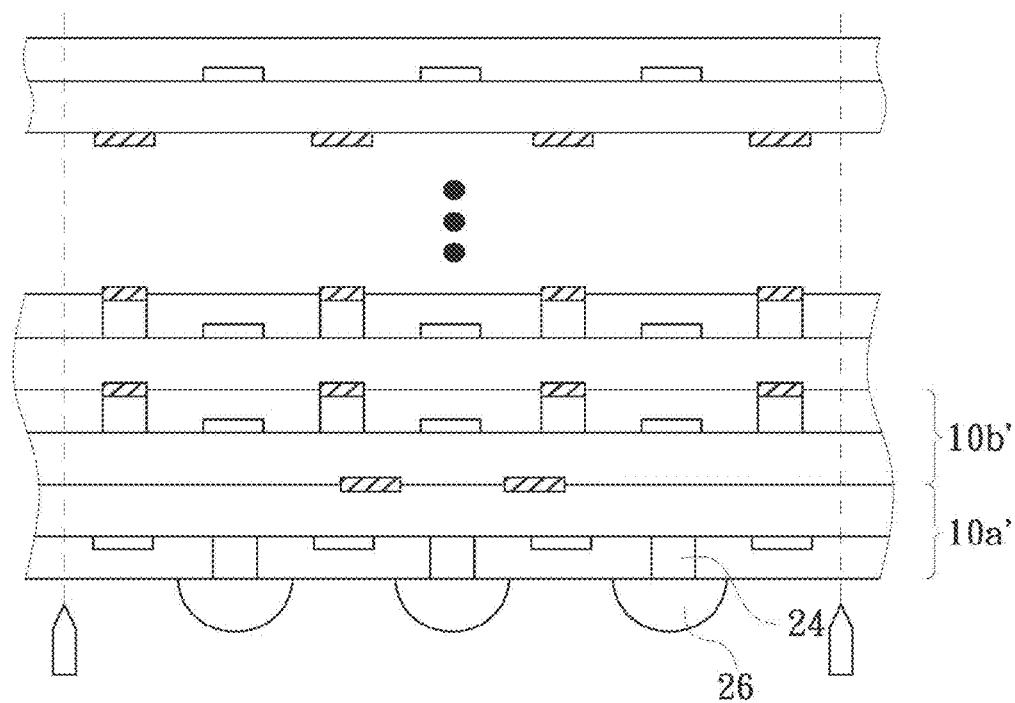
Figure 1S:
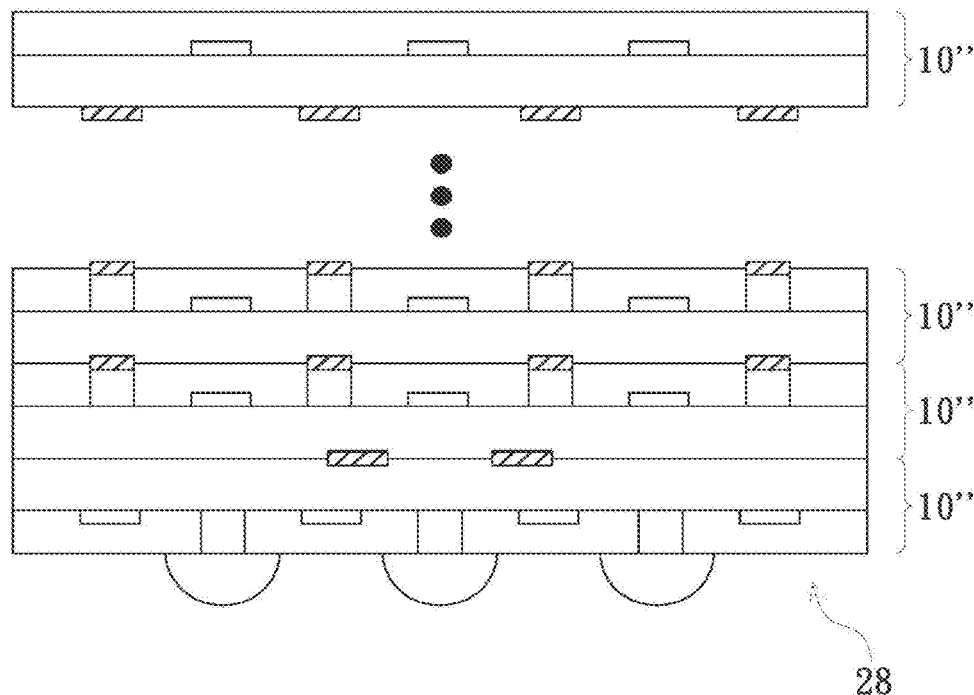

FIG. 1A to FIG. 1S show schematic cross-sectional diagrams of a method for manufacturing a semiconductor stack structure with an ultra-thin die according to a first embodiment of the present disclosure. First, a plurality of semiconductor wafers 10 (shown in FIG. 1E) are manufactured, one of the semiconductor wafers 10 is selected as a first semiconductor wafer 10a (shown in FIG. 1F) at a bottom layer of a stack, and the other ones of the semiconductor wafers 10 are selected as a second semiconductor wafer 10b (shown in FIG. 1F) and a third semiconductor wafer 10c (shown in FIG. 1L) to be stacked. The plurality of semiconductor wafers 10 are manufactured by the same or similar process. FIG. 1A to FIG. 1E show schematic cross-sectional diagrams of manufacturing of the semiconductor wafers 10. As shown in FIG. 1A, a semiconductor substrate 12 is provided. The semiconductor substrate 12 is a silicon substrate, an epitaxial silicon substrate, a silicon germanium substrate, a silicon carbide substrate or a silicon on insulation (SOI) substrate, etc. In one embodiment, a thickness of the semiconductor substrate is, for example, 700-800 micron (um), preferably, 775 microns. The semiconductor substrate 12 has an active surface 121 and a backside 122 that are opposite to each other.

Then, a stop layer structure is formed in the semiconductor substrate 12. In one embodiment, the stop layer structure is manufactured by at least one ion implantation process and a high temperature treatment process. In one embodiment, the ion implantation process includes nitrogen ion implantation followed by oxygen ion implantation. As shown in FIG. 1B and FIG. 1C, the nitrogen ion implantation process 14 is carried out at a first depth D1 of the semiconductor substrate 12 first, and then the oxygen ion implantation process 16 is carried out at a second depth D2 of the semiconductor substrate 12. According to one embodiment, the first depth D1 of a nitrogen ion implanted region 14' is, for example, about 1-5 microns away from the active surface 121, and the second depth D2 of an oxygen ion implanted region 16' is smaller than the first depth D1 of the nitrogen ion implanted region 14', that is, the oxygen ion implanted region 16' is closer to the active surface 121.

Then high temperature treatment is carried out. As shown in FIG. 1D, a silicon nitride ($Si_3N_4$) layer 14a is formed in the nitrogen ion implanted region 14', a silicon dioxide ($SiO_2$) layer 16a is formed in the oxygen ion implanted region 16', the silicon dioxide layer 16a is closer to the active surface 121, and the silicon nitride layer 14a is closer to the backside 122. In this embodiment, the silicon nitride layer 14a and the silicon dioxide layer 16a constitute the above stop layer structure 18. The silicon dioxide layer 16a is located on the silicon nitride layer 14a and disposed between the silicon nitride layer 14a and the active surface 121. In one embodiment, a thickness of the silicon nitride layer 14a and a thickness of the silicon dioxide layer 16a are, for example, 500 nanometers (nm). Further, for the convenience of explanation, a portion, between the silicon dioxide layer 16a of the stop layer structure 18 and the active surface 121, of the semiconductor substrate 12 is referred to as a first substrate part 123, and a portion, between the silicon nitride layer 14a of the stop layer structure 18 and the backside 122, of the semiconductor substrate 12 is referred to as a second substrate part 124. In one embodiment, when the semiconductor wafer 10 is subsequently applied to the manufacturing of a metal oxide semiconductor field-effect transistor (MOSFET), in order to match a general N well with a depth of about 2 microns, a thickness of the first substrate part 123 shall be maintained to be not less than 2 microns, that is, the first depth D1 of the nitrogen ion implanted region 14' and the second depth of the oxygen ion implanted region 16' should both be slightly greater than 2 microns during the nitrogen ion implantation process 14 and the oxygen ion implantation process 16.

Continuing the above description, as shown in FIG. 1E, a plurality of electrical components 20 and an inner connection layer 22 with interconnection points 221 are provided on the active surface 121. The electrical components 20 include, for example, metal oxide semiconductors (MOS). Moreover, a plurality of conductive structures are disposed on the first substrate part 123. In one embodiment, the conductive structures include, for example, through silicon vias (TSVs) 24, and the through silicon vias 24 are vertically connected to the inner connection layer 22 and the silicon dioxide layer 16a of the stop layer structure 18. A process for manufacturing the electrical components 20, the inner connection layers 22 and the through silicon vias 24 includes front-end-of-line (FEOL) and back-end-of-line (BEOL) of a general process for manufacturing semiconductors. For example, in the front-end-of-line, resistors, capacitors, diodes, transistors and other components are made on the semiconductor substrate 12. For example, in the back-end-of-line, metal wires and the interconnection points 221 are made between the components. In one embodiment, the interconnection points 221 are, for example, copper contacts. FIG. 1E shows a schematic diagram of a semiconductor wafer 10 according to an embodiment of the present disclosure. The first semiconductor wafer 10a, the second semiconductor wafer 10b, and the third semiconductor wafer 10c described below follow the component symbols used in the description of the semiconductor wafer 10. The positions of the through silicon vias 24 of the first semiconductor wafer 10a, for example, correspond to mounting positions of solder balls in the subsequent process, and the positions of the through silicon vias 24 of the second semiconductor wafer 10b, for example, correspond to the interconnection points 221 of the inner connection layer 22 of the third semiconductor wafer 10c.

As shown in FIG. 1F, the second semiconductor wafer 10b is flipped with respect to the first semiconductor wafer 10a, such that the inner connection layers 22 of the first semiconductor wafer 10a and the second semiconductor wafer 10b are opposite, and the interconnection points 221 of the two correspond respectively. Next, the first semiconductor wafer 10a and the second semiconductor wafer 10b are stacked up and down by hybrid bonding, as shown in FIG. 1G. The hybrid bonding includes copper-copper bonding, tempering and other processes.

Next, the backside 122 of the second semiconductor wafer 10b is ground by using a first backside grinding process to remove a portion of the second substrate part 124 of the second semiconductor wafer 10b. As shown in FIG. 1H, the residual second substrate part 124 has an ultra-small thickness. In one embodiment, the residual second substrate part 124 has a thickness of about 20.

Then, a first thinning process is carried out to form a thinned second semiconductor wafer. The first thinning process includes a step of substrate removal and a step of stop layer removal. FIG. 1I to FIG. 1K show the schematic diagrams of the first thinning process. The step of substrate removal is used for removing the residual second substrate part 124, as shown in FIG. 1I, to expose the stop layer structure 18. For example, in order to expose the silicon nitride layer 14a, in one embodiment, the step of substrate removal is a first chemical mechanical polishing (CMP) process, where a selection ratio of silicon to silicon nitride is, for example, 20, that is, $Si/Si_3N_4$ is 20. The step of stop layer removal is used for removing the stop layer structure 18, that is, removing the silicon nitride layer 14a and the silicon dioxide layer 16a in sequence to expose the first substrate part 123 and the through silicon vias 24. In one embodiment, the silicon nitride layer 14a is removed first by a second chemical mechanical polishing process, as shown in FIG. 1J, to expose the silicon dioxide layer 16a, where a selection ratio of silicon nitride to silicon dioxide is, for example, 10, that is, $Si_3N_4/SiO_2$ is 10; and then the silicon dioxide layer 16a is removed by a third chemical mechanical polishing process, as shown in FIG. 1K, to expose the first substrate part 123 and the through silicon vias 24, where a selection ratio of silicon dioxide to silicon is, for example, 5, that is, $SiO_2/Si$ is 5. A thinned second semiconductor wafer 10b' is formed due to exposure of the first substrate part 123 and the through silicon vias 24.

As described above, the stacking of the first semiconductor wafer 10a and the second semiconductor wafer 10b' has been completed. Next, as shown in FIG. 1L, the third semiconductor wafer 10c is flipped with respect to the first semiconductor wafer 10a, such that the inner connection layer 22 of the third semiconductor wafer 10c faces the first substrate part 123 of the thinned second semiconductor wafer 10b'. In one embodiment, the interconnection points 221 of the inner connection layer 22 of the third semiconductor wafer 10c correspond to the through silicon vias 24 of the thinned second semiconductor wafer 10b' respectively. The first backside grinding process and the first thinning process are then repeatedly carried out to complete the stacking of a thinned third semiconductor wafer 10c' and the thinned second semiconductor wafer 10b'. In one embodiment, a thickness of the thinned second semiconductor wafer 10b' or the thinned third semiconductor wafer 10c' is, for example, 12 microns. Thus, on the premise that the plurality of semiconductor wafers 10 are provided, the bonding process, the first backside grinding process and the first thinning process of the above-mentioned semiconductor wafers 10 are repeatedly carried out one by one to complete the stacking of a plurality of layers of thinned semiconductor wafers 10' and the first semiconductor wafers 10a, as shown in FIG. 1M. In one embodiment, for a thinned semiconductor wafer 10' stacked on the top, a first substrate part 123 thereof may be provided with no through silicon via 24.

After stacking of a plurality of thinned semiconductor wafers 10' of a predetermined number is completed, the backside 122 of the first semiconductor wafer 10a is ground by the second backside grinding process, as shown in FIG. 1N, to remove a portion of the second substrate part 124 of the first semiconductor wafer 10a, leaving the second substrate part 124 with an ultra-small thickness. Then, the second thinning process is carried out, as shown in FIG. 1O to FIG. 1Q. The residual second substrate part 124 of the first semiconductor wafer 10a, the silicon nitride layer 14a and the silicon dioxide layer 16a are removed in sequence by using the above steps of substrate removal and stop layer removal, so as to expose the first substrate part 123 and the through silicon vias 24 of a thinned first semiconductor wafer 10a'. In this way, stacking of the thinned first semiconductor wafer 10a', the thinned second semiconductor wafer 10b', the thinned third semiconductor wafer 10c' and other thinned semiconductor wafers 10' is completed.

Then, as shown in FIG. 1R, a plurality of solder balls 26 are provided on a side, away from the thinned second semiconductor wafer 10b', of the thinned first semiconductor wafer 10a' to be electrically connected to the exposed through silicon vias 24 respectively. Moreover, after chip probing (CP) is carried out to test electrical functions, die sawing is carried out to complete the semiconductor stack structure 28 with the ultra-thin die as shown in FIG. 1S. Each layer of thinned semiconductor wafer 10' is used as a semiconductor chip layer 10" after being subjected to die sawing. Since the thickness of each thinned semiconductor wafer 10' may be, for example, 12 microns, under the limitation of a total chip thickness of 700 microns, 57 thinned semiconductor chip layers 10" may be stacked for the semiconductor stack structure 28 with the ultra-thin die according to the embodiment of the present disclosure, thereby meeting the requirements for high integration and high speed, and having better electrical characteristics and efficiency.

In the first thinning process and the second thinning process described above, the step of substrate removal and the step of stop layer removal are illustrated as including three chemical mechanical polishing processes in total, which is not limited thereto. In another embodiment, the first/second thinning process includes a wet etching process and two chemical mechanical polishing processes, that is, in the step of substrate removal, the first chemical mechanical polishing process is replaced with the wet etching process. The schematic cross-sectional diagrams of the thinning processes may still be shown in FIG. 1H to FIG. 1K or FIG. 1N to FIG. 1Q. The residual second substrate part 124 is removed first by the wet etching process to expose the silicon nitride layer 14a, where a selection ratio of silicon to silicon nitride is, for example, 40 during the wet etching process, that is, $Si/Si_3N_4$ is 40; and then the second chemical mechanical polishing process and the third chemical mechanical polishing process are carried out in sequence to remove the silicon nitride layer 14a and silicon dioxide layer 16a in sequence.

In another embodiment, in the first/second thinning process, the above three chemical mechanical polishing processes may also be replaced with three plasma dry etching processes. The schematic cross-sectional diagrams of the thinning processes may still be shown in FIG. 1H to FIG. 1K or FIG. 1N to FIG. 1Q. The residual second substrate part 124 is removed first by a first plasma dry etching process to expose the silicon nitride layer 14a. In one embodiment, a selection ratio of silicon to silicon nitride in the first plasma dry etching process is, for example, 80, that is, $Si/Si_3N_4$ is 80. Next, the silicon nitride layer 14a is removed by a second plasma dry etching process to expose the silicon dioxide layer 16a. In one embodiment, a selection ratio of silicon nitride to silicon dioxide in the second plasma dry etching process is, for example, 20, that is, $Si_3N_4/SiO_2$ is 20. Next, the silicon dioxide layer 16a is removed by a third plasma dry etching process to expose the first substrate part 123 and the through silicon vias 24. In one embodiment, a selection ratio of silicon dioxide and silicon in the third plasma dry etching process is, for example, 5, that is, $SiO_2/Si$ is 5.

Figure 2A:
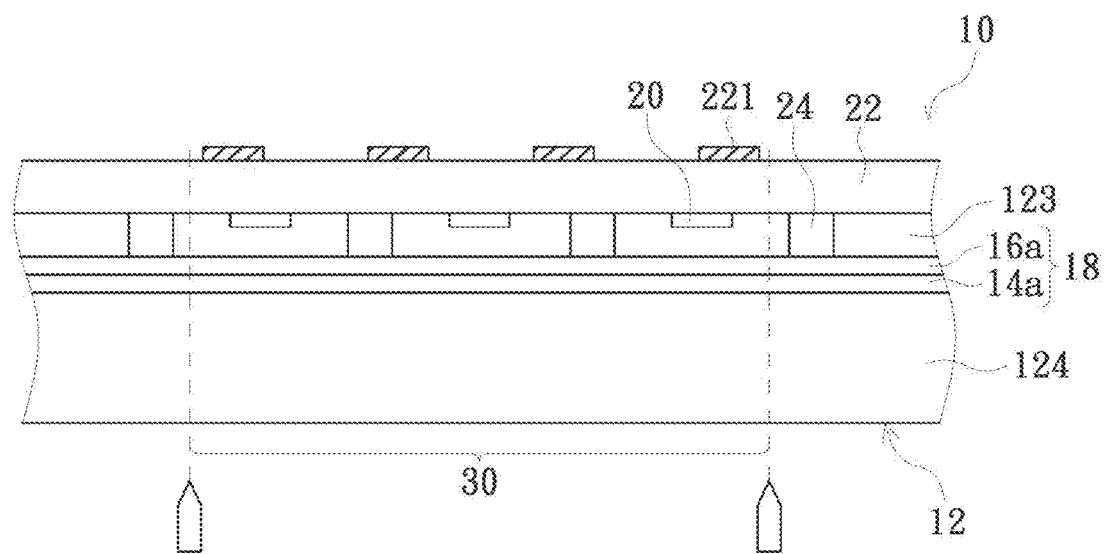
FIG. 2A to FIG. 2K show schematic cross-sectional diagrams of a method for manufacturing a semiconductor stack structure with an ultra-thin die according to a second embodiment of the present disclosure.

The first embodiment above is implemented by way of wafer on wafer (WoW), but is not limited thereto. FIG. 2A to FIG. 2K show schematic cross-sectional diagrams of a method for manufacturing a semiconductor stack structure with an ultra-thin die according to a second embodiment of the present disclosure. In the second embodiment, a plurality of semiconductor wafers 10 are provided first, the manufacturing steps of which are as shown in FIG. 1A to FIG. 1E above and will not be repeated here. Then, a part of the semiconductor wafers 10 is selected as a first semiconductor wafer 10a (shown in FIG. 2B) at a bottom layer, the other part of the semiconductor wafers 10 are subjected to electrical function testing to select grains with good electrical functions for die sawing, as shown in FIG. 2A, so as to obtain a plurality of semiconductor chips 30. Each of the semiconductor chips 30 still includes electrical components 20, an inner connection layer 22, and a semiconductor substrate 12. A stop layer structure 18 is formed in the semiconductor substrate 12, and the semiconductor substrate 12 is divided by the stop layer structure 18 into a first substrate part 123 and a second substrate part 124. Through silicon vias 24 are provided in the first substrate part 123 to connect the stop layer structure 18 with the inner connection layer 22. Hereinafter, for the convenience of description, the plurality of semiconductor chips 30 are divided into a first batch of semiconductor chips 30a and a second batch of semiconductor chips 30b according to the sequence of subsequent manufacturing processes, each batch including a plurality of semiconductor chips 30.

Figure 2B:
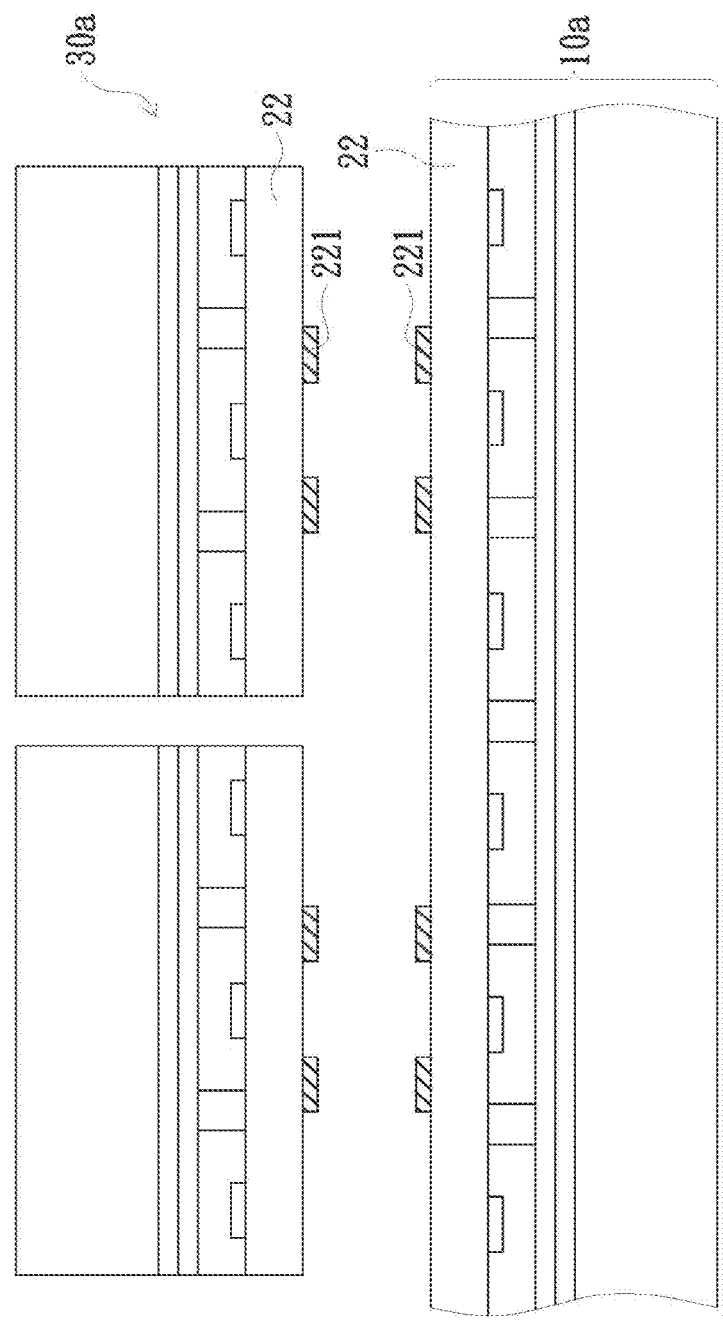
Figure 2C:
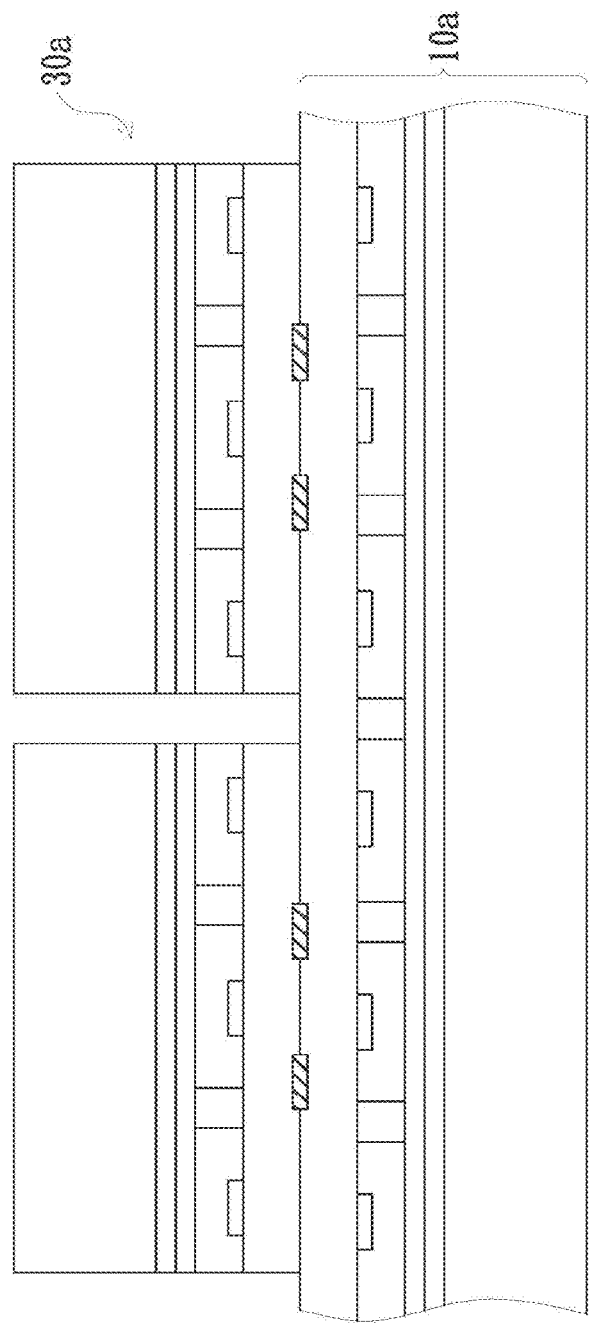

As shown in FIG. 2B, the first batch of semiconductor chips 30a are flipped with respect to the first semiconductor wafer 10a, such that the inner connection layers 22 of the first batch of semiconductor chips 30a are opposite to the inner connection layer 22 of the first semiconductor wafer 10a, and the interconnection points 221 of the first batch of semiconductor chips correspond to the interconnection points of the first semiconductor wafer respectively. The first semiconductor wafer 10a is bonded with the first batch of semiconductor chips 30a up and down by using hybrid bonding, as shown in FIG. 2C.

Figure 2D:
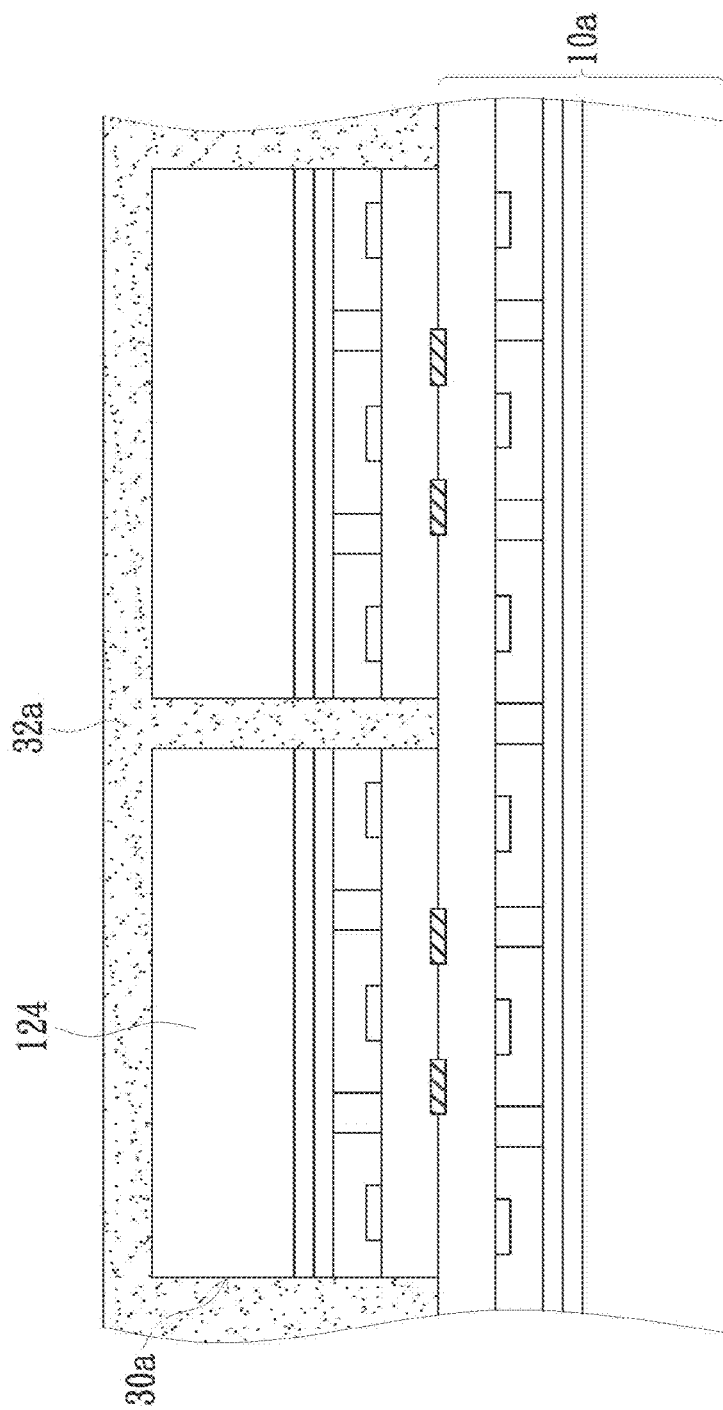
Figure 2E:
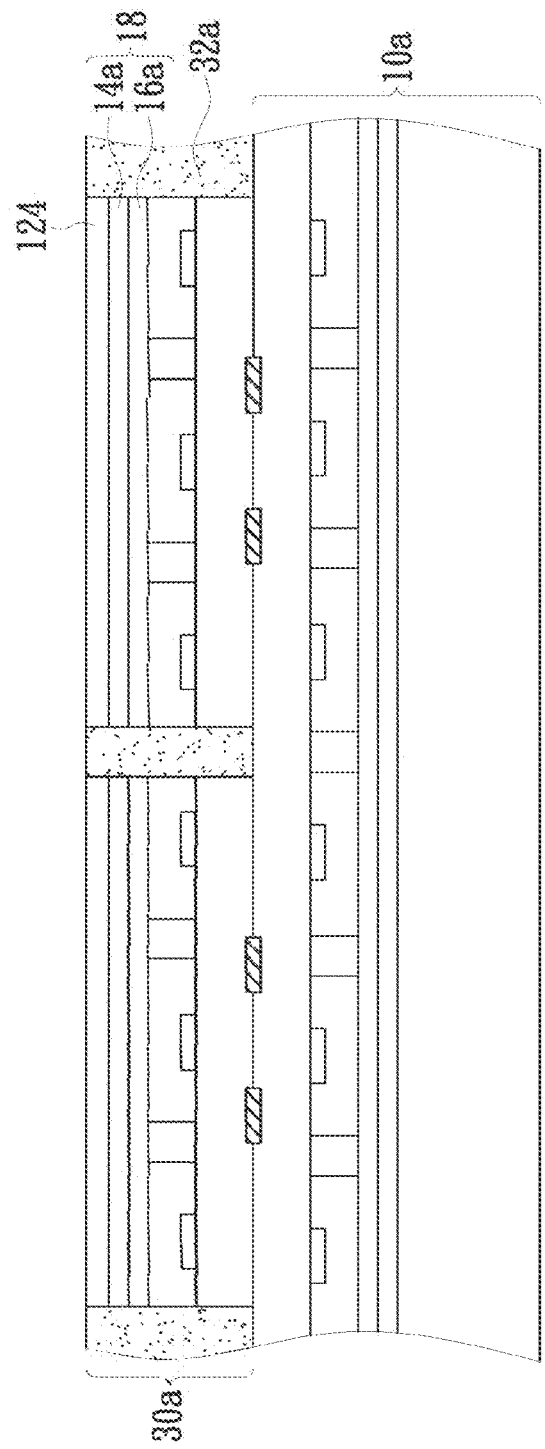

Next, a first molding process is carried out. As shown in FIG. 2D, a first molding compound 32a is formed on the first semiconductor wafer 10a to cover the first batch of semiconductor chips 30a. Then, part of the first molding compound 32a and a portion of the second substrate parts 124 of the first batch of semiconductor chips 30a are removed from a side, away from the first semiconductor wafer 10a, of the first molding compound 32a by using a first backside grinding process. As shown in FIG. 2E, the residual second substrate parts 124 of the first batch of semiconductor chips 30a have an ultra-small thickness, and the residual first molding compound 32a is flush with the second substrate parts 124.

Figure 2F:
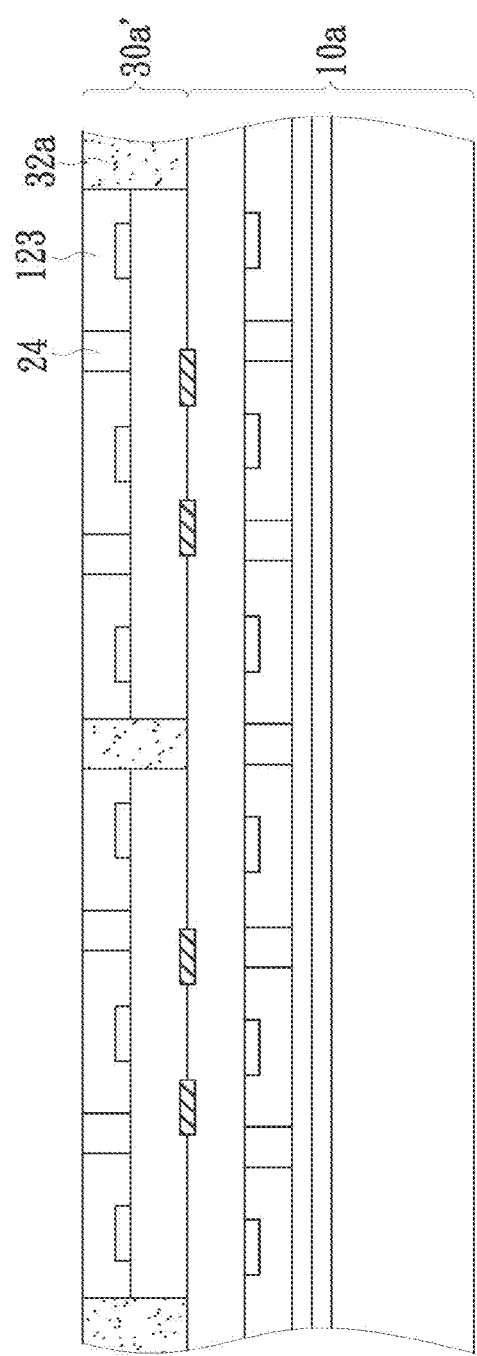

Then, a first thinning process is carried out, including the step of substrate removal and the step of stop layer removal described in the first embodiment, so as to remove the residual second substrate part 124s, the stop layer structures 18, and part of the molding compound 32 of the first batch of semiconductor chips 30a. As shown in FIG. 2F, the first substrate parts 123 and through silicon vias 24 of the first batch of semiconductor chips 30a are exposed, such that a thinned first semiconductor chip layer 30a' is formed. The first semiconductor chip layer 30a' is stacked on the first semiconductor wafer 10a.

Figure 2G:
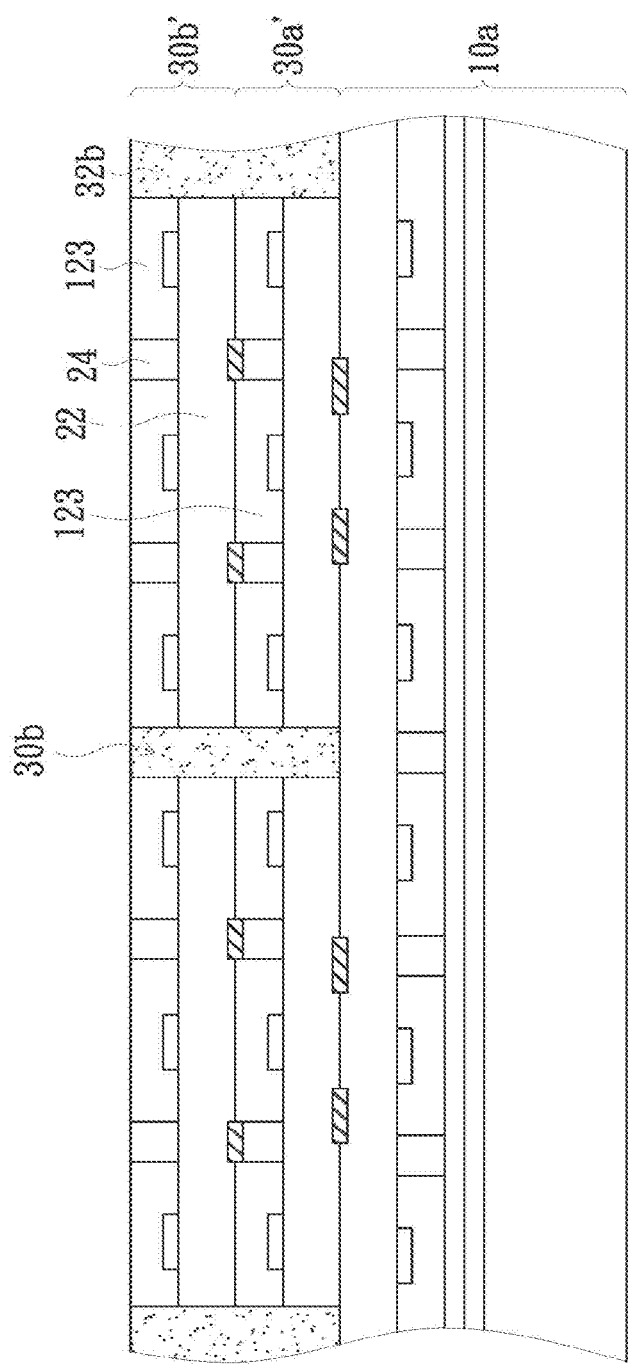
Figure 2H:
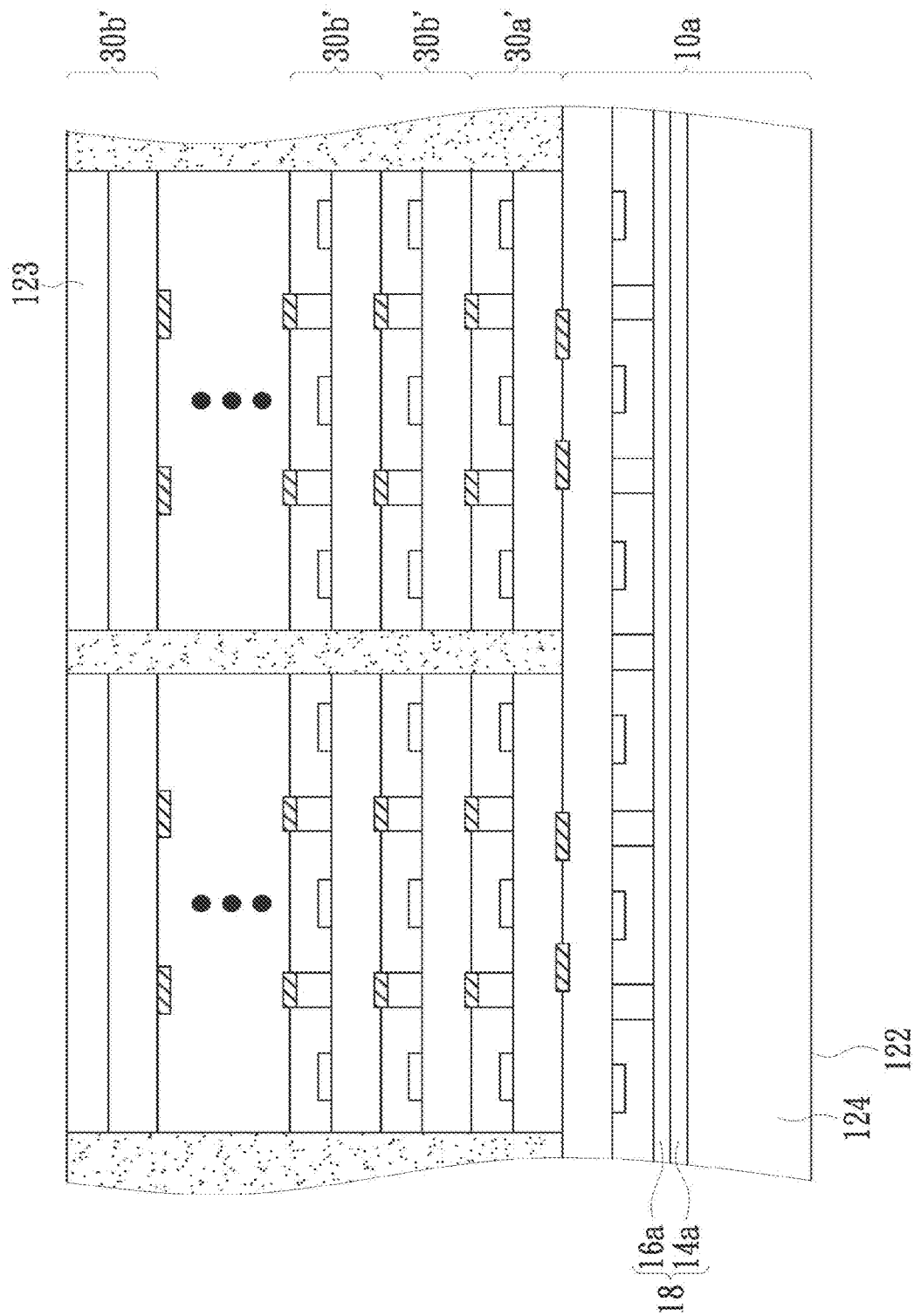

Next, the second batch of semiconductor chips 30b are still flipped with respect to the first semiconductor wafer 10a, such that the inner connection layers 22 of the second batch of semiconductor chips 30b correspond to the first substrate parts 123 of the first semiconductor chip layer 30a' respectively, and the second batch of semiconductor chips 30b are bonded with the first semiconductor chip layer 30a'. A second molding process is carried out to form a second molding compound 32b on the first semiconductor chip layer 30a' to cover the second batch of semiconductor chips 30b. A backside grinding process and a thinning process are carried out to remove part of the second molding compound 32b, the second substrate parts (not shown) of the second batch of semiconductor chips 30b, and the stop layer structures (not shown) from a side, away from the first semiconductor chip layer 30a', of the second molding compound 32b. As shown in FIG. 2G, the first substrate parts 123 and the through silicon vias 24 of the second batch of semiconductor chips 30b are exposed to form a thinned second semiconductor chip layer 30b'. Thus, the bonding process, molding process, backside grinding process, and first thinning process of the above batch of semiconductor chips 30 are repeatedly carried out batch by batch to complete the stacking of the first semiconductor chip layer 30a' and the plurality of second semiconductor chip layers 30b' to the first semiconductor wafer 10a, as shown in FIG. 2H. In one embodiment, for a second semiconductor chip layer 30b' stacked on the top, the first substrate part 123 thereof may be provided with no through silicon via 24.

Figure 2I:
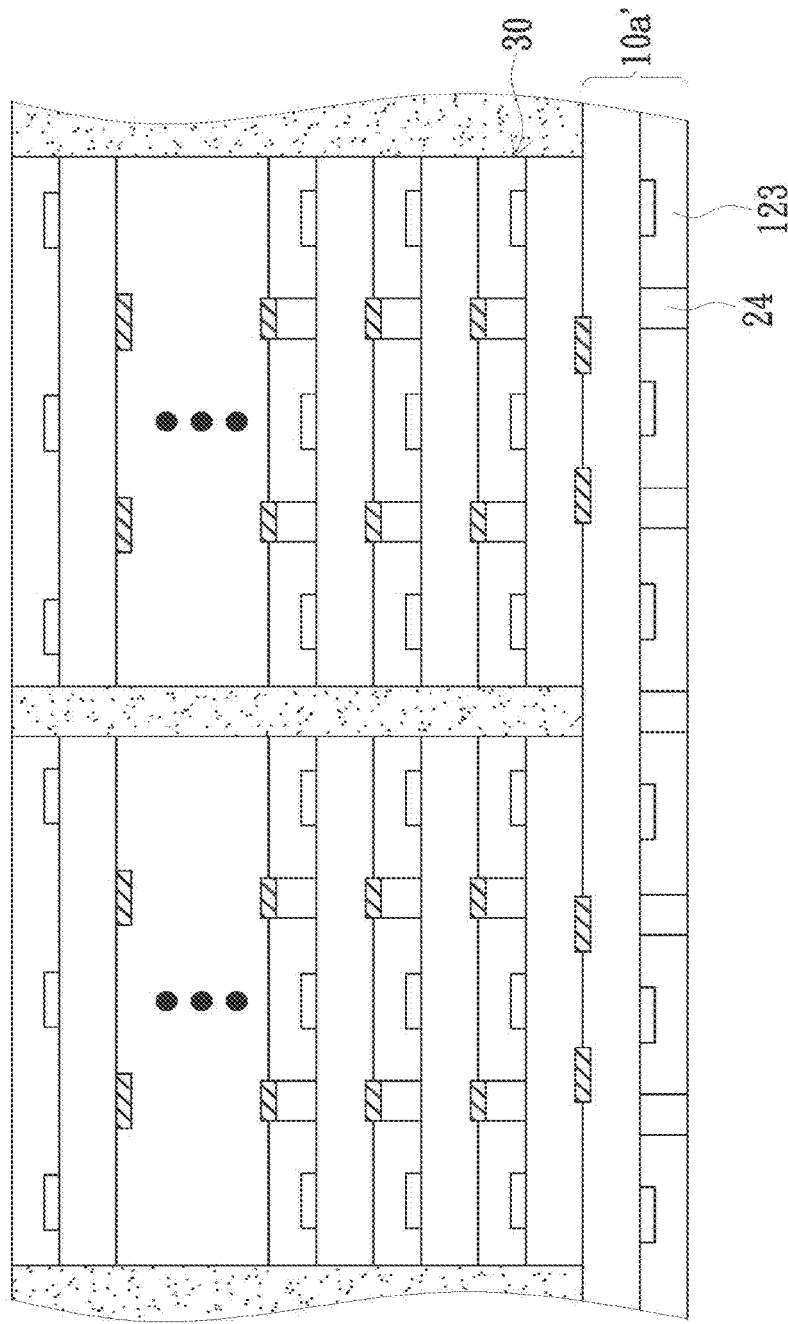

Next, as in the first embodiment, after stacking of a predetermined number of second semiconductor chip layers 30b' is completed, the second substrate part 124 and the stop layer structure 18 of the first semiconductor wafer 10a are removed in sequence from the backside 122 of the first semiconductor wafer 10a by using a second backside grinding process and a second thinning process, as shown in FIG. 2I, to expose the first substrate part 123 and the through silicon vias 24. Thus, stacking of a thinned first semiconductor wafer 10a' and the plurality of semiconductor chips 30 is completed.

Each of the first thinning process and the second thinning process includes the step of substrate removal and the step of stop layer removal described in the first embodiment. The process selection for the step of substrate removal and the step of stop layer removal, such as three chemical mechanical polishing processes, or a combination of a wet etching process with chemical mechanical polishing processes, or plasma dry etching processes, as well as the use of selection ratios among silicon, silicon nitride, and silicon dioxide materials has been described in the first embodiment and will not be repeated here.

Figure 2J:
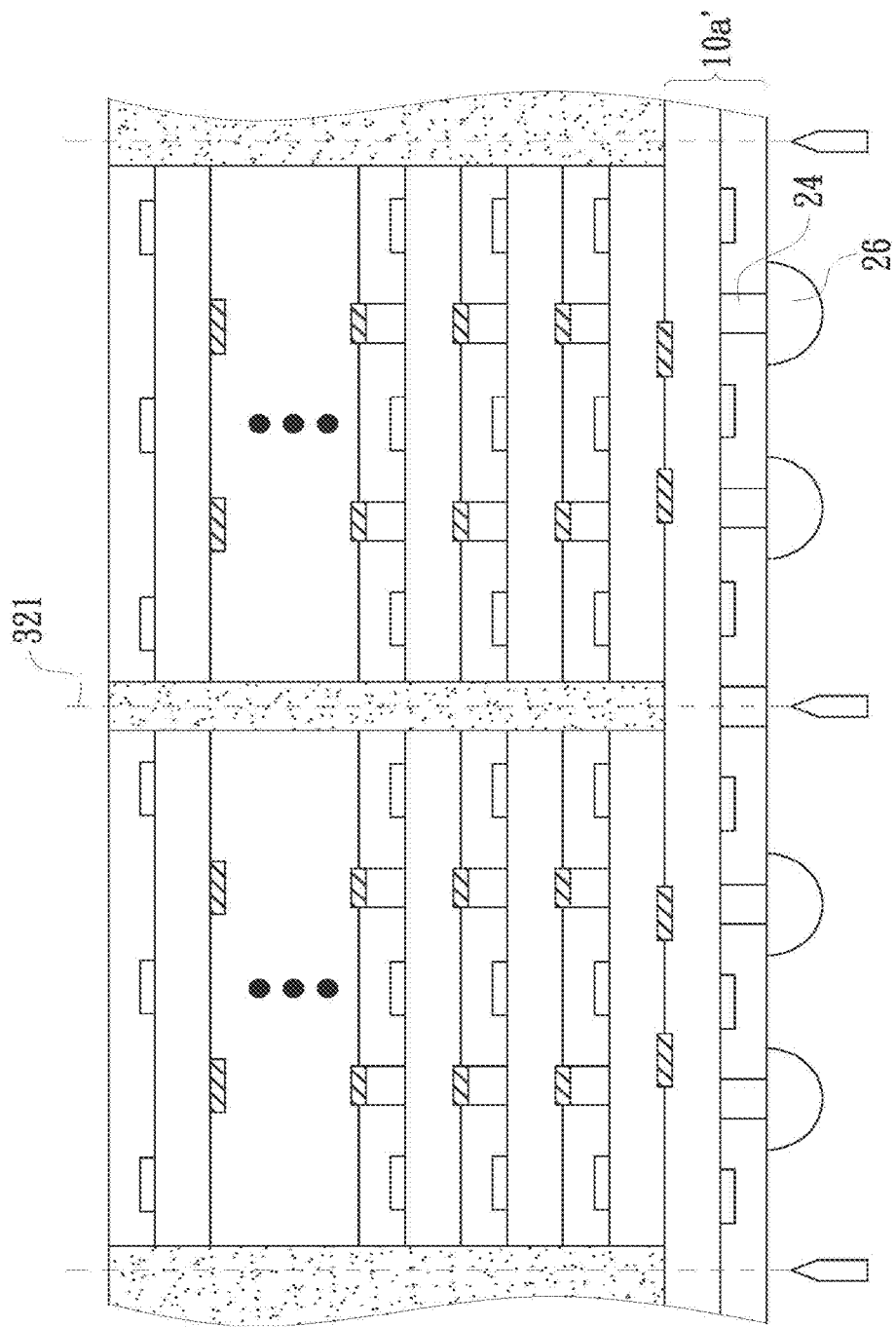
Figure 2K:
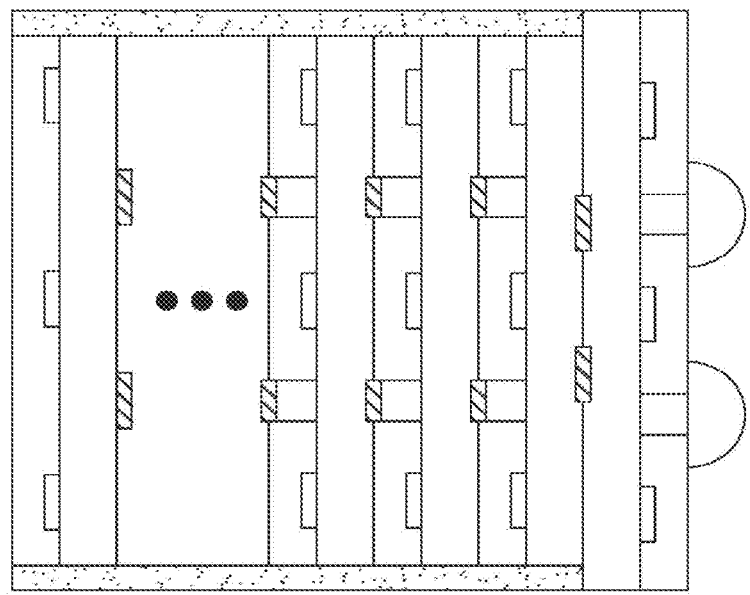

Then, as shown in FIG. 2J, solder balls are provided at the exposed through silicon vias 24 of the thinned first semiconductor wafer 10a'. Moreover, after electrical function testing is carried out, die sawing is carried out along a sawing channel 321 of the first molding compound 32a and the second molding compound 32b to complete a semiconductor stack structure 34 with an ultra-thin die as shown in FIG. 2K. In the semiconductor stack structure 34 with the ultra-thin die according to this embodiment, as the stacked semiconductor chips 30 have been subjected to electrical function testing and selection, the semiconductor stack structure 34 with the ultra-thin die has a high yield.

Figure 3A:
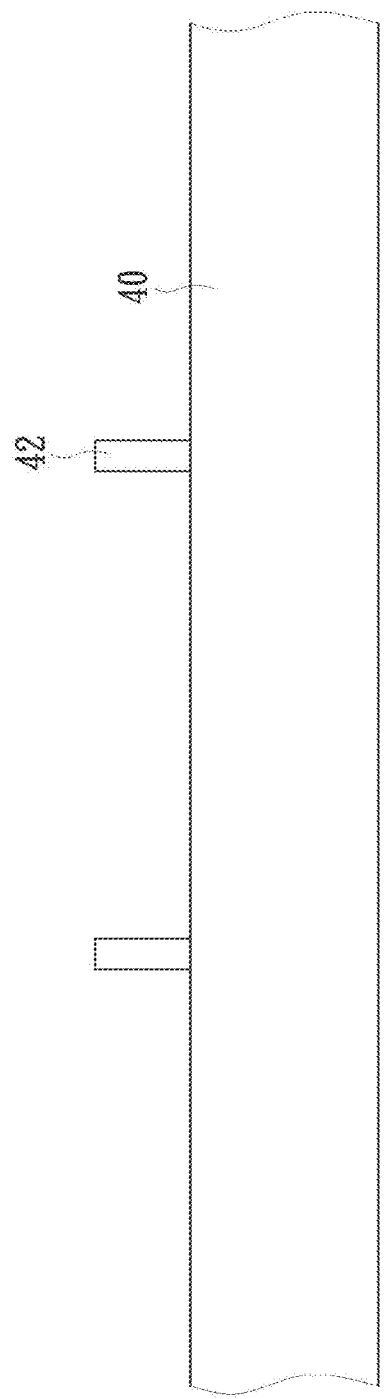

FIG. 3A to FIG. 3L show schematic cross-sectional diagrams of a method for manufacturing a semiconductor stack structure with an ultra-thin die according to a third embodiment of the present disclosure. In the third embodiment, first, a bearing plate 40 is provided, and a plurality of first conductive posts 42 are formed on the bearing plate 40, as shown in FIG. 3A. The bearing plate 40 is, for example, glass with a thickness of 500 microns and a length of 301 millimeters (mm), and the first conductive posts 42 are, for example, copper posts.

Next, a plurality of semiconductor chip 44 (shown in FIG. 3B) subjected to electrical function testing are selected. The semiconductor chips 44 may have the same or different electrical functions. Various types of semiconductor chips 44 are obtained by carrying out die sawing on various types of semiconductor wafers 10 respectively. The manufacturing steps of each type of semiconductor wafers 10 have been shown in FIG. 1A to FIG. 1E above and will not be repeated here. Each of the semiconductor chips 44 still includes electrical components 20, an inner connection layer 22, and a semiconductor substrate 12. A stop layer structure 18 is formed in the semiconductor substrate 12, and the semiconductor substrate 12 is divided by the stop layer structure 18 into a first substrate part 123 and a second substrate part 124. Through silicon vias 24 are provided in the first substrate part 123 to connect the stop layer structure 18 with the inner connection layer 22. In one embodiment, a thickness of the semiconductor substrate 12 is, for example, 775 microns, and a thickness of the inner connection layer 22 is, for example, 10 microns.

Figure 3B:
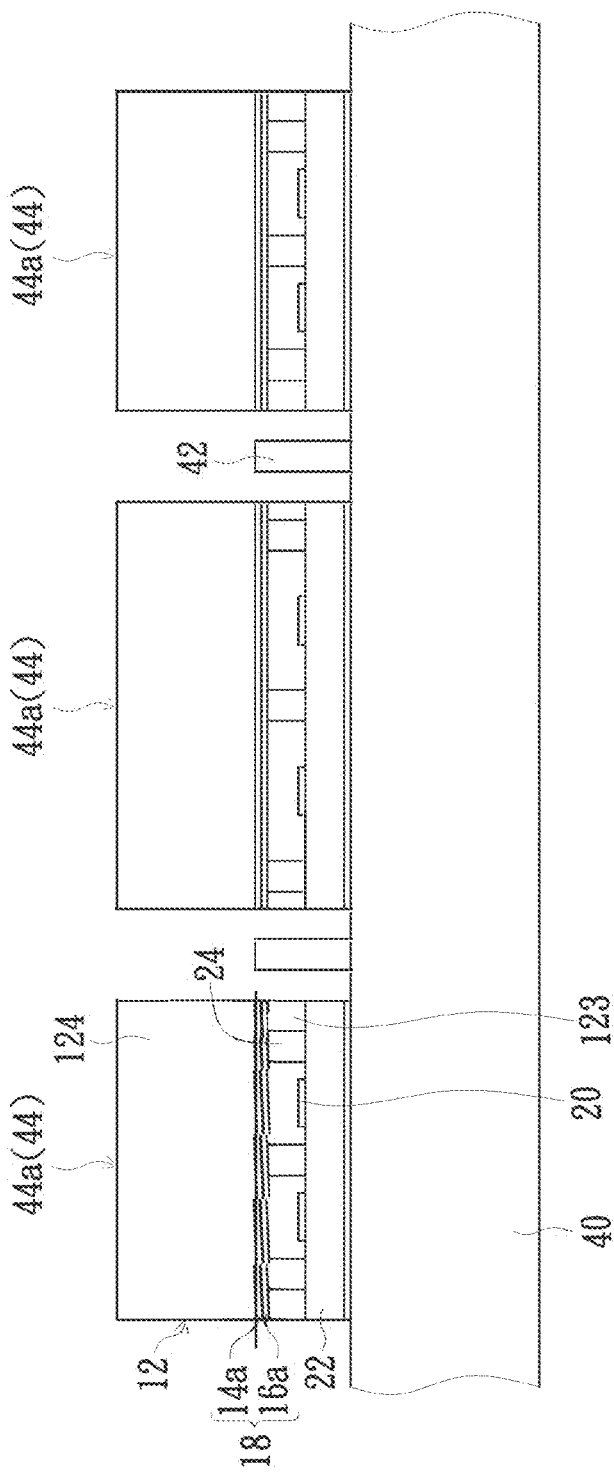

A first batch of selected semiconductor chips are flipped and bonded to the bearing plate 40. As shown in FIG. 3B, taking the first batch of semiconductor chips 44 including three first semiconductor chips 44a as an example, the three first semiconductor chips 44a may have the same or different electrical functions, and the first conductive posts 42 are disposed between the adjacent first semiconductor chips 44a. In one embodiment, the first semiconductor chips 44a are flipped and bonded by enabling the inner connection layers 22 to be adjacent to the bearing plate 40 and the semiconductor substrate 12 to be away from the bearing plate 40.

Figure 3C:
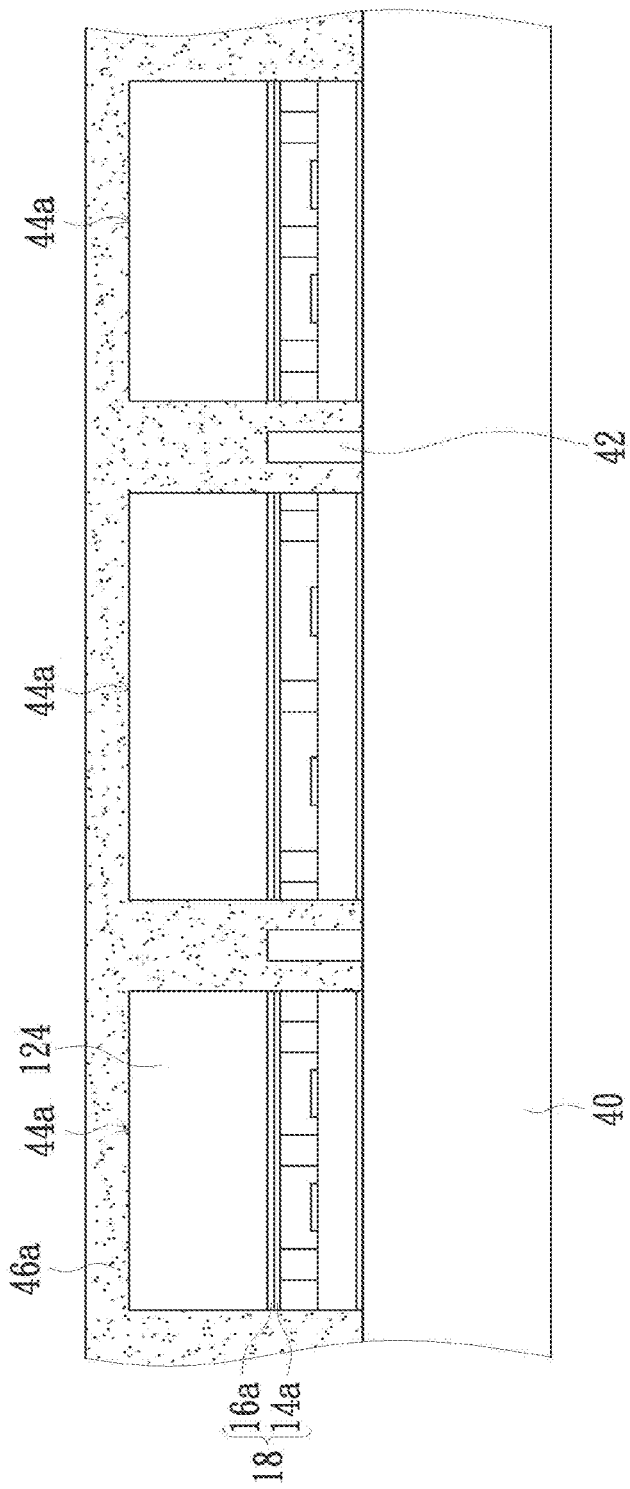
Figure 3D:
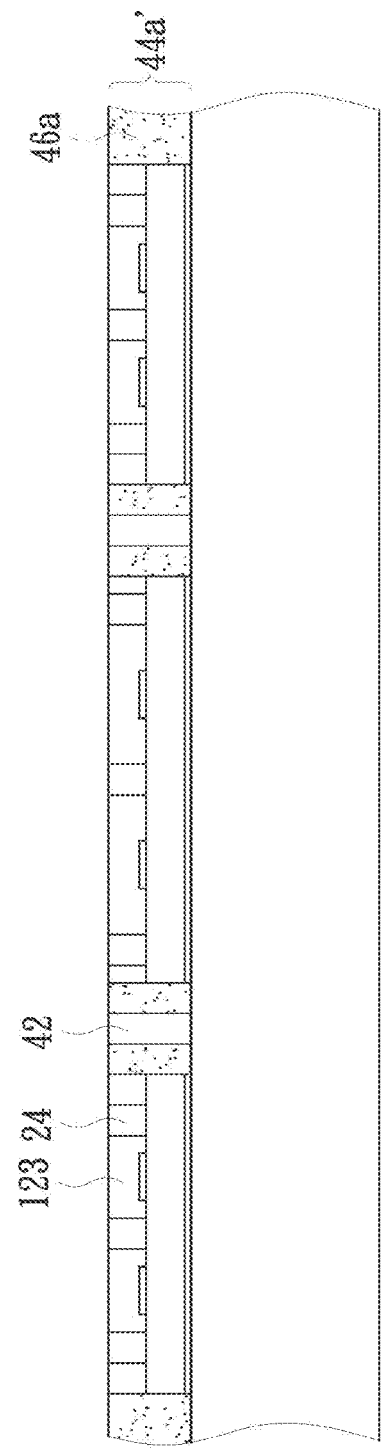

Then, a first molding process is carried out. As shown in FIG. 3C, a first molding compound 46a is formed on the bearing plate 40 to cover the three first semiconductor chips 44a and the first conductive posts 42. Then, part of the first molding compound 46a and the second substrate parts 124 and the stop layer structures 18 of the first semiconductor chips 44a are removed from a side, away from the bearing plate 40, of the first molding compound 46a by using a first backside grinding process and a first thinning process. As shown in FIG. 3D, the first substrate parts 123, the through silicon vias 24, and the first conductive posts 42 are exposed, such that a thinned first semiconductor chip layer 44a' is formed.

Figure 3E:
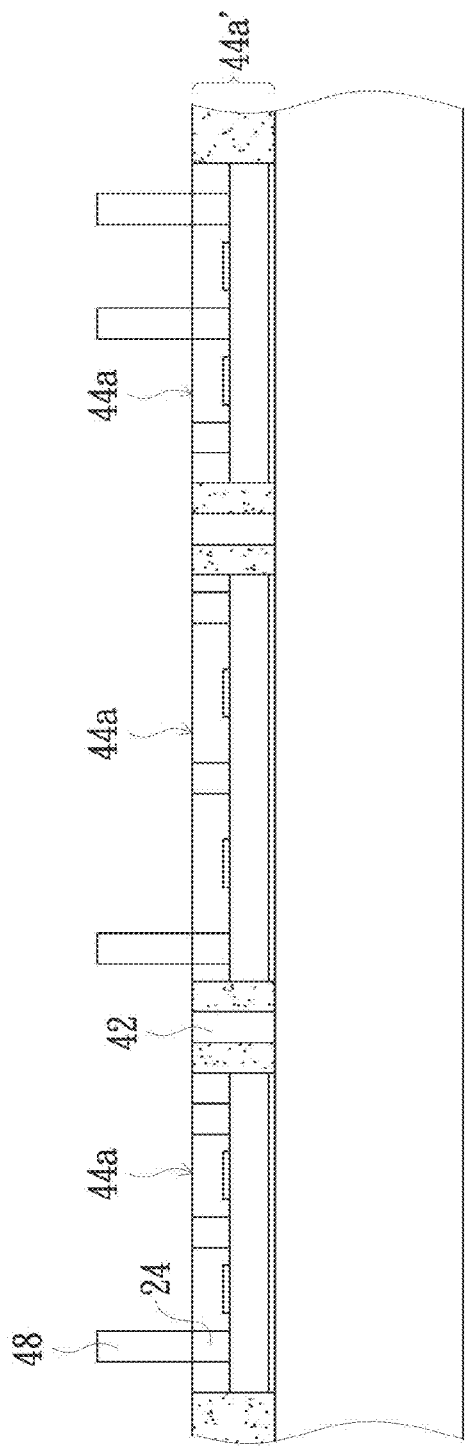
Figure 3F:
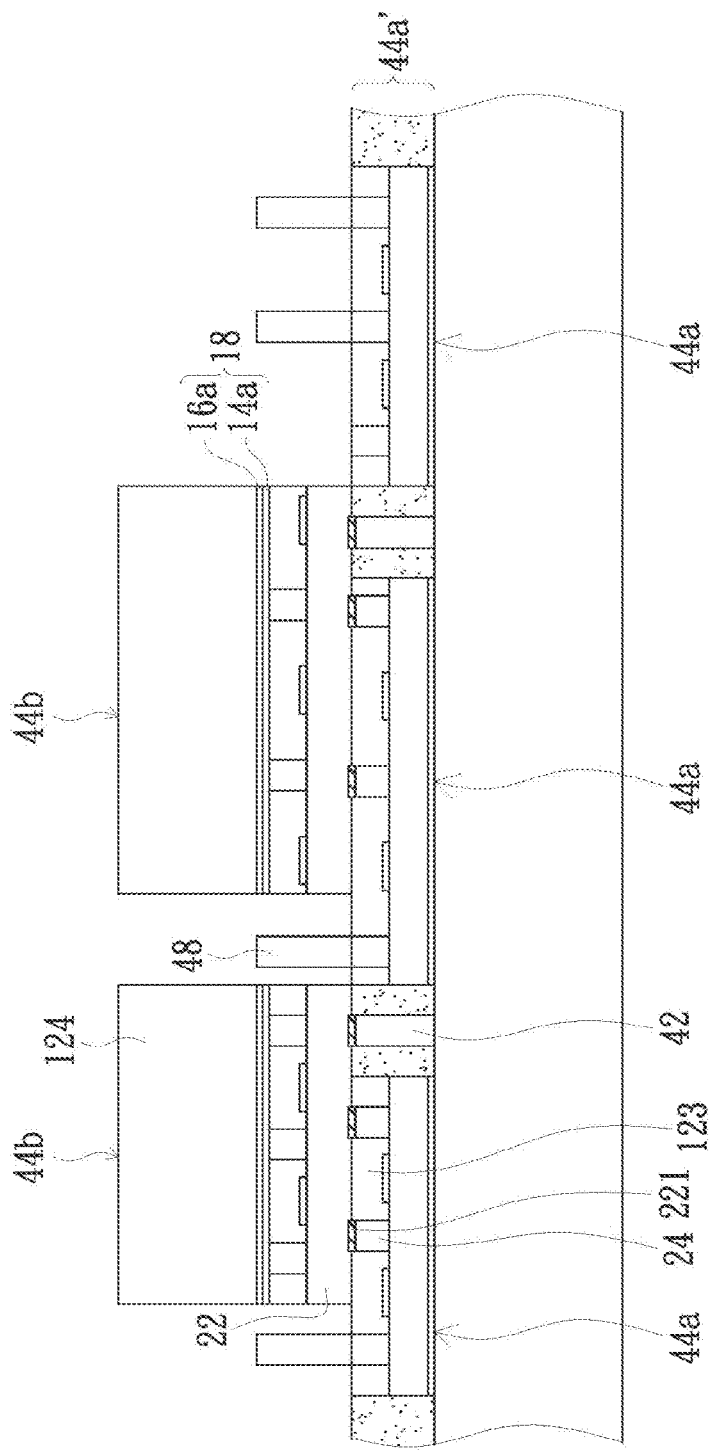

Then, second conductive posts 48 is provided, for example, the second conductive posts 48 are vertically disposed on part of through silicon vias 24. As shown in FIG. 3E, the second conductive posts 48 are disposed in at least one of the through silicon vias 24 of each thinned first semiconductor chip 44a. The second conductive posts 48 are, for example, copper posts. Then, the second batch of selected semiconductor chips are flipped and connected between every two adjacent thinned first semiconductor chips 44a in a crossing manner. As shown in FIG. 3F, taking the second batch of semiconductor chips including two second semiconductor chips 44b as an example, the two semiconductor chips 44b may have the same or different electrical functions. In one embodiment, the inner connection layers 22 of the second semiconductor chips 44b are opposite to the first substrate parts 123 of the first semiconductor chip layer 44a', the interconnection points 221 of the second semiconductor chips 44b are electrically connected to part of the through silicon vias 24 and the first conductive posts 42, and part of the second conductive posts 48 are disposed between the adjacent second semiconductor chips 44b.

Figure 3G:
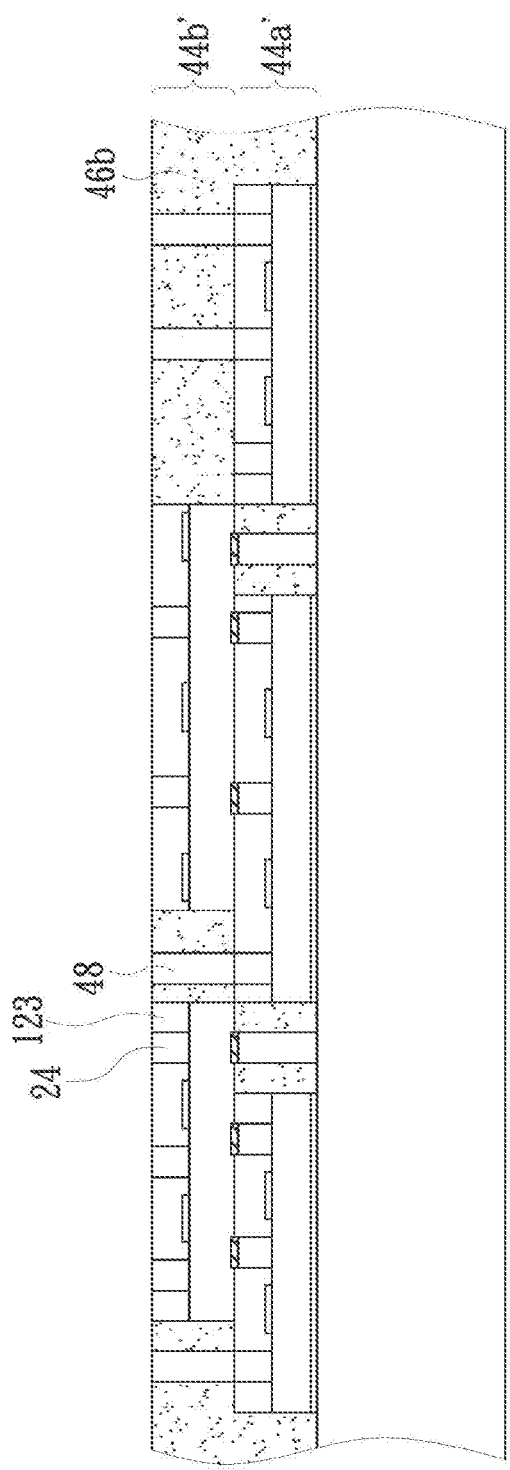

Then, a second molding process, a second backside grinding process and a second thinning process are carried out in sequence to form a second molding compound 46b on the first semiconductor chip layer 44a' to cover the second semiconductor chips 44b and the second conductive posts 48. Then, the second substrate parts 124 and the stop structure layers 18 of the second semiconductor chips 44b as well as part of the second molding compound 46b are removed through a second backside grinding process and a second thinning process. As shown in FIG. 3G, the first substrate parts 123, the through silicon vias 124, and the second conductive posts 48 are exposed, such that a thinned second semiconductor chip layer 44b' is formed.

Figure 3H:
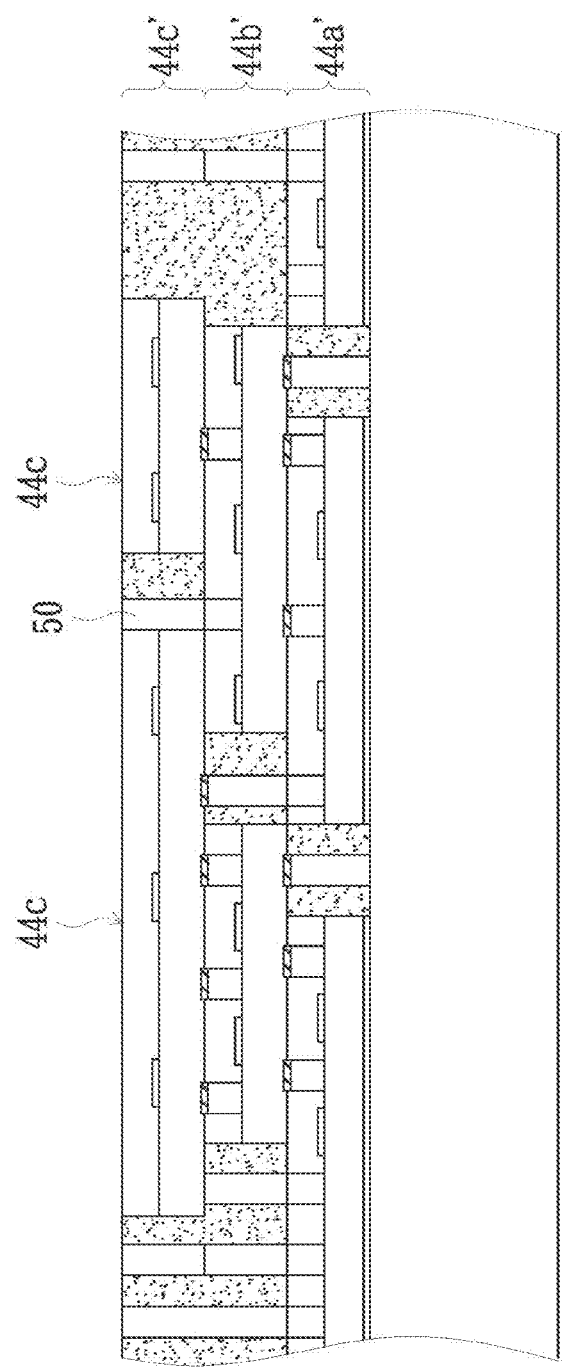
Figure 31:
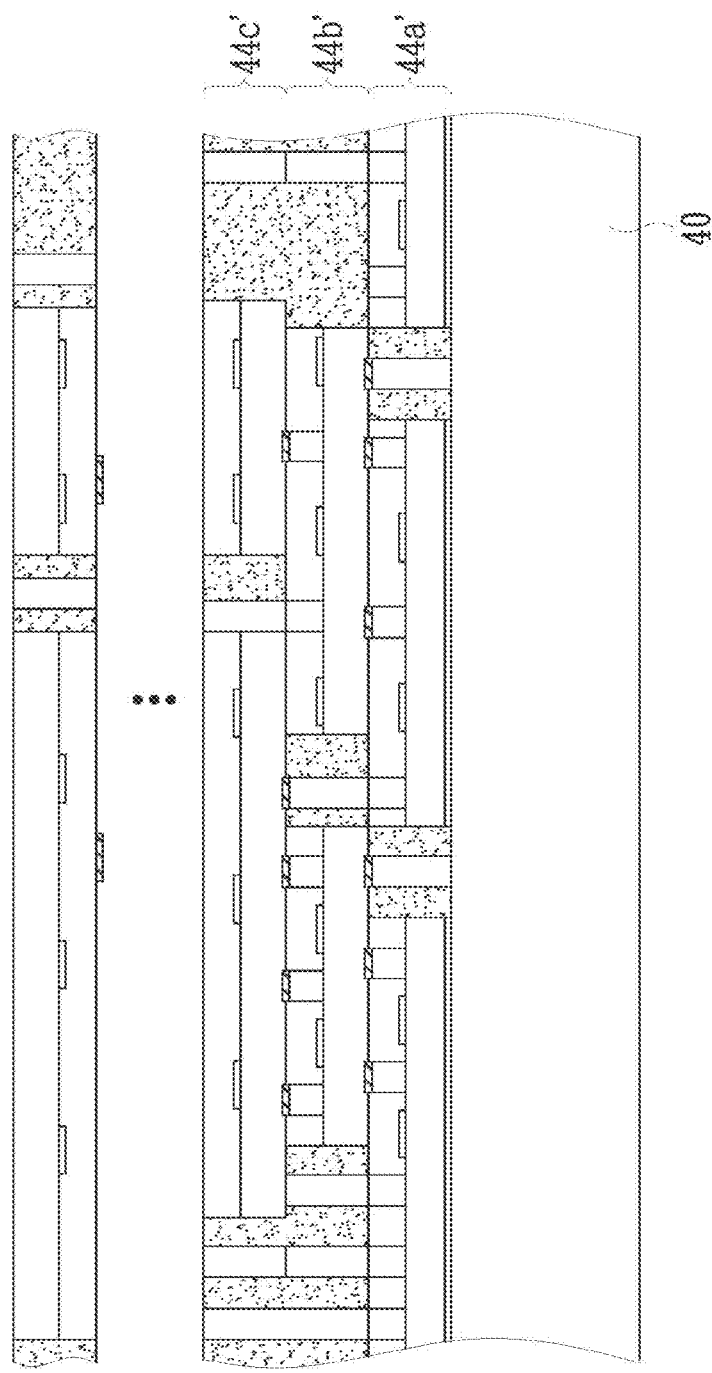

Thus, the operations of providing third conductive posts 50, flipping third semiconductor chips 44c on the second semiconductor chip layer 44b', a molding compound molding process, a backside grinding process, and a thinning process are carried out repeatedly to complete stacking of a third semiconductor chip layer 44c', as shown in FIG. 3H, as well as stacking of more semiconductor chip layers successively, as shown in FIG. 3I.

Figure 3J:
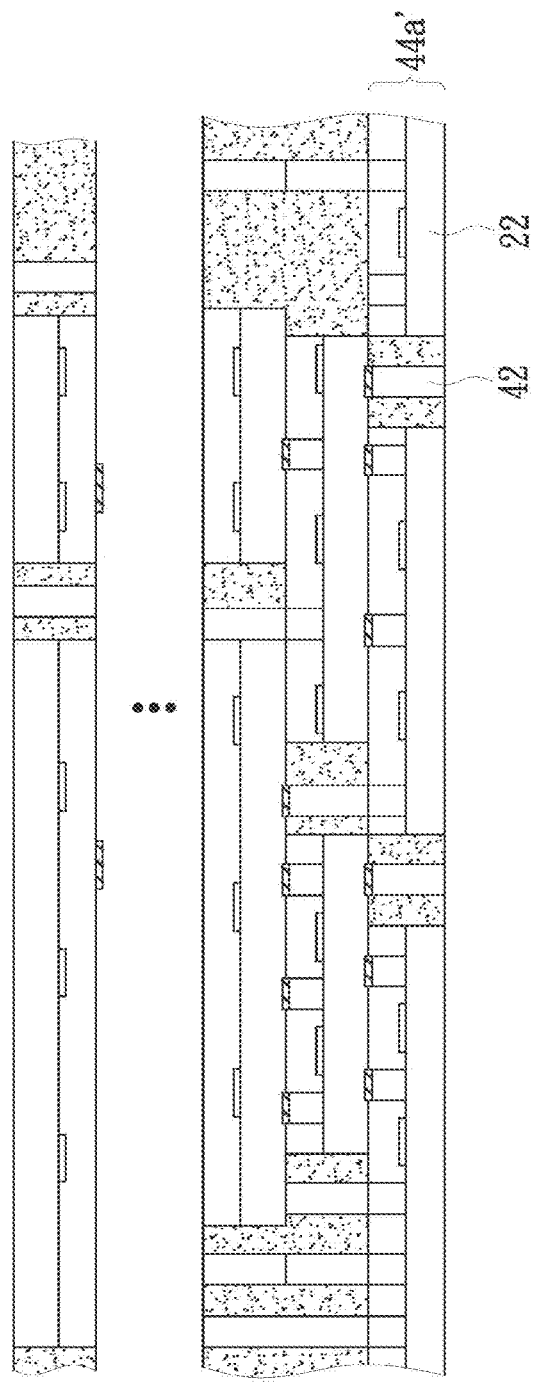
Figure 3K:
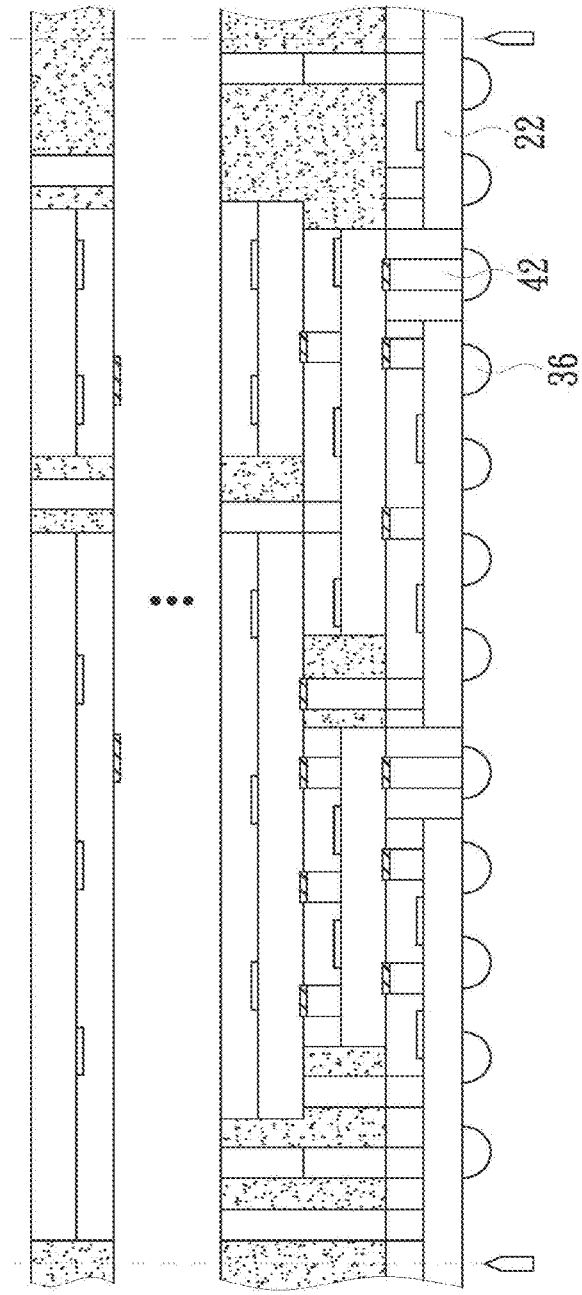
Figure 3L:
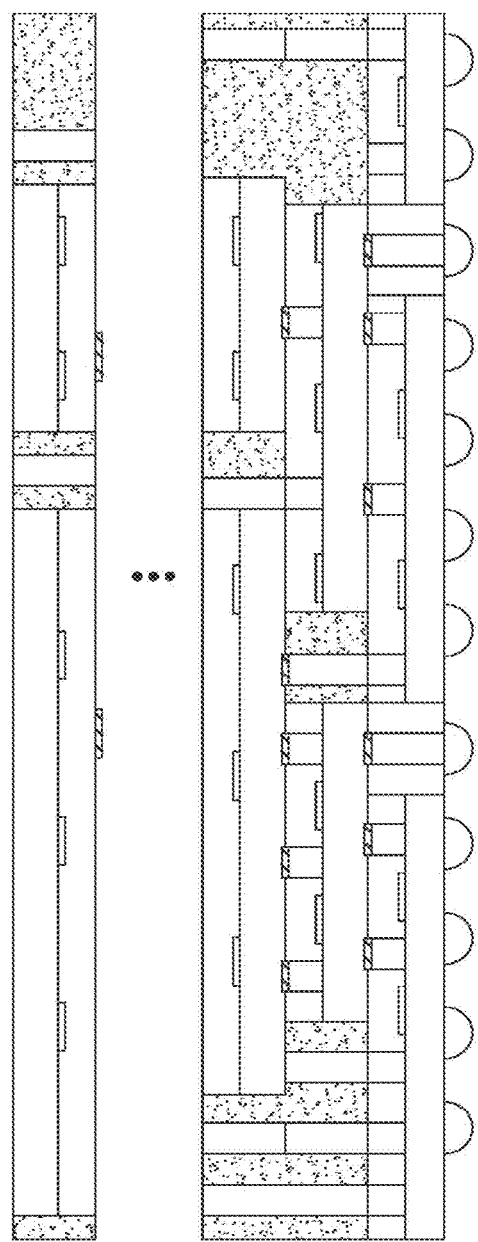

Then, the bearing plate 40 is removed, as shown in FIG. 3J, to expose the inner connection layer 22 and the first conductive posts 42 of the first semiconductor chip layer. Solder balls 26 are provided on preset circuit contacts (not shown) of the inner connection layer 22 and the first conductive posts, as shown in FIG. 3K. Die sawing is carried out to complete a semiconductor stack structure 52 with an ultra-thin die as shown in FIG. 3L.

In the method for manufacturing the semiconductor stack structure with the ultra-thin die according to the first/second/third embodiment, the manufacturing of the stop layer structure is illustrated by successively carrying out nitrogen ion implantation and oxygen ion implantation and carrying out high temperature treatment to form the silicon nitride layer and the silicon dioxide layer. However, the present disclosure is not limited thereto. In one embodiment, the stop layer structure may only include the silicon nitride layer, that is, the high temperature treatment process is carried out after the nitrogen ion implantation process is carried out in the semiconductor substrate, such that the silicon nitride layer is formed at a depth of 1-5 microns away from the active surface. Accordingly, in the step of stop layer removal of the subsequent first/second thinning process, only the silicon nitride layer needs to be removed, and other subsequent processes are the same, which will not be repeated here.

In the embodiments of the present disclosure, as the stop layer structure is formed at a depth of the semiconductor substrate, and the step of substrate removal and the step of stop layer removal are carried out one by one in the subsequent thinning process, the semiconductor substrate may indeed be ground or etched until only the first substrate part is retained, that is, the retained substrate thickness is only 1-5 microns, such that the overall thickness of each semiconductor chip layer is not greater than 12 microns, and under the limitation of a total chip thickness of 700 microns, more than 50 thinned semiconductor chip layers may be stacked in the semiconductor stack structure 28 with the ultra-thin die according to the embodiments of the present disclosure, thereby meeting the requirements for high integration and high speed and having better electrical characteristics and efficiency.

It should be noted that terms like "first," "second," "third," etc., are used to distinguish different information, processes, steps, components, parts, devices, modules, etc., and do not represent any order, nor do they limit "first" and "second" to being different types or same types. For example, in different embodiments or contexts, articles modified by same reference number, e.g., "first," may refer to different articles. As an example, the first semiconductor wafer described in the specification is not needed to be included in some of the claims, and thus, the first semiconductor wafer in those claims may refer to the second semiconductor wafer in the specification, and the second semiconductor wafer in those claims may refer to the third semiconductor wafer in the specification. These all should be viewed and understood within its own context.

As used herein, "or" is inclusive and not exclusive, unless expressly indicated otherwise or indicated otherwise by context. Therefore, herein, "A, B, or C" means "A, B, A and B, A and C, B and C, or A, B, and C," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context. Moreover, plural instances may be provided for resources, operations, or structures described herein as a single instance. Additionally, boundaries between various resources, components, devices, wafers, chips, and processes are somewhat arbitrary. A particular item as claimed should be limited by the boundaries illustrated in the drawings and described in the specification.

The term "include" or "comprise" is used to indicate the existence of the subsequently declared features, but it does not exclude the addition of other features. Conditional language, such as, among others, "can," "could," "might," or "may," unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

The various features and processes described above may be used independently of one another or may be combined in various ways. All possible combinations and sub-combinations are intended to fall within the scope of this disclosure. In addition, certain method, process, or step may be omitted in some implementations. The methods, processes, and steps described herein are also not limited to any particular order, and the processes or states relating thereto can be performed in other orders that are appropriate. For example, described processes or states may be performed in an order other than that specifically disclosed, or multiple processes or states may be combined in a single process or state. The example processes or states may be performed in serial, in parallel, or in some other manner. The reference numbers such as 1A, 1B, 12, 14, etc., are used to distinguish different steps, processes, or components, and do not represent any execution order. Processes or states may be added to or removed from the disclosed example embodiments. Based on the embodiments of the present application, all other embodiments obtained by those skilled in the art without creative efforts fall within the protection scope of the present application.

The above description are merely preferred embodiments of the present disclosure and are not intended to limit the present disclosure in any form. Although the present disclosure has been disclosed as above with the preferred embodiments, the present disclosure is not limited thereto, and any person skilled in the art may, without departing from the scope of the technical solutions of the present disclosure, use the above-described method and technical contents revealed above to make some changes or modifications into equivalent embodiments of equivalent variations. However, any simple modifications, equivalent changes and modifications made to the above embodiments according to the technical substance of the present disclosure, without departing from the content of the technical solutions of the present disclosure, still fall within the scope of the technical solutions of the present disclosure.

What is claimed is:

1. A method for manufacturing a stack structure, comprising:
    manufacturing a plurality of wafers, the manufacturing of each of the plurality wafers comprising:
       providing a substrate having an active surface and a backside;
       implanting nitrogen ions at a first depth from the active surface;
       implanting oxygen ions at a second depth from the active surface of the wafer, the first depth being greater than the second depth;
       performing high temperature treatment to form a silicon nitride layer at the first depth and a silicon dioxide layer at the second depth, the silicon nitride layer and the silicon dioxide layer forming a stop layer, the stop layer dividing the substrate into a first substrate part at a side of the active surface and a second substrate part at a side of the backside;
       forming a plurality of conductive structures in the first substrate part;
       forming a connection layer comprising a plurality of interconnection points on the active surface, the conductive structures being connected to the connection layer and the stop layer;
    performing a backside grinding and thinning process on a first wafer of the plurality of wafers, comprising:
       grinding the backside to remove a portion of the second substrate part at the backside;
       removing the remaining second substrate part to expose the stop layer;
       removing the stop layer to expose the first substrate part;
    bonding a second wafer of the plurality of wafers on the first wafer with the connection layer of the second wafer facing the first substrate part of the first wafer exposed by removing the stop layer and performing the same backside grinding and thinning process on the second wafer to remove the second substrate part and the stop layer of the second wafer;
    repeating the bonding and backside grinding and thinning process with one or more wafers to form a stack of bonded and thinned wafers.

2. The method of claim 1, wherein the removing the remaining second substrate part to expose the stop layer comprises performing a wet etching process on the remaining second substrate part.

3. The method of claim 2, wherein the wet etching process uses a selection ratio of silicon to silicon nitride of 20-80.

4. The method of claim 1, wherein the removing the remaining second substrate part to expose the stop layer comprises performing a chemical mechanical polishing process with a selection ratio of silicon to silicon nitride of 20-80.

5. The method of claim 1, wherein the removing the remaining second substrate part to expose the stop layer comprises performing a plasma dry etching process with a selection ratio of silicon to silicon nitride of 20-80.

6. The method of claim 1, wherein the removing the stop layer to expose the first substrate part comprises removing the silicon nitride layer and the silicon dioxide layer in sequence.

7. The method of claim 1, wherein the removing the stop layer to expose the first substrate part comprises performing a chemical mechanical polishing process on the silicon nitride layer to remove the silicon nitride layer with a selection ratio of silicon nitride to silicon dioxide of 10-20.

8. The method of claim 7, wherein the removing the stop layer to expose the first substrate part comprises performing a chemical mechanical polishing process on the silicon dioxide layer to remove silicon dioxide layer with a selection ratio of silicon dioxide to silicon of 5.

9. The method of claim 1, wherein the first depth is about 1-5 microns from the active surface.

10. The method of claim 1, wherein the thickness of the silicon nitride layer and the silicon dioxide layer is about 500 nanometers.

11. The method of claim 1, wherein the plurality of conductive structures include through silicon vias and the positions of the through silicon vias of the first wafer correspond to the interconnection points of the connection layer of the second semiconductor wafer.

12. A method for manufacturing a semiconductor stack structure, comprising:
    manufacturing a plurality of semiconductor wafers, wherein each of the plurality of semiconductor wafers is manufactured by the following steps:
       providing a semiconductor substrate having an active surface and a backside; and
       carrying out a nitrogen ion implantation process at a first depth from the active surface of the semiconductor substrate, carrying out an oxygen ion implantation process at a second depth of the semiconductor substrate, the second depth being less than the first depth, and then carrying out a high temperature treatment process to form a silicon nitride layer and a silicon dioxide layer, the silicon nitride layer and the silicon dioxide layer forming a stop layer, the stop layer dividing the semiconductor substrate into a first substrate part between the stop layer and the active surface and a second substrate part between the stop layer and the backside;

carrying out a backside grinding process from the backside of a first semiconductor wafer of the plurality of semiconductor wafers to remove a portion of the second substrate part of the semiconductor wafer;

carrying out a thinning process to form a thinned semiconductor wafer, the thinning process comprising: removing the remaining second substrate part to expose the stop layer and removing the stop layer to expose the first substrate part;

bonding another semiconductor wafer of the plurality of semiconductor wafers to the first semiconductor wafer with the active surface of the another semiconductor wafer facing a surface of the first semiconductor wafer exposed by removing the stop layer;

carrying out the same backside grinding process from the backside of the another semiconductor wafer to remove a portion of the second substrate part of the another semiconductor wafer, and carrying out the same thinning process to remove the remaining second substrate part to expose the stop layer and remove the stop layer to expose the first substrate part of the another semiconductor wafer; and repeating the bonding, the backside grinding, and the thinning process on one or more semiconductor wafers of the plurality of semiconductor wafers to bond more wafers.

13. The method of claim 12, wherein the steps for manufacturing each of the plurality of semiconductor wafers further comprise:
forming a plurality of conductive structures in the first substrate part between the active surface and the stop layer.

14. The method of claim 12, wherein the steps for manufacturing each of the plurality of semiconductor wafers further comprise:
forming a connection layer on the active surface, wherein the connection layer includes interconnections points thereon.

15. The method of claim 12, wherein the removing the stop layer to expose the first substrate part comprises removing the silicon nitride layer and then removing the silicon dioxide layer.

16. The method of claim 15, wherein the removing the silicon nitride layer comprises one of chemical mechanical polishing or plasma dry etching with a selection ratio of silicon nitride to silicon dioxide of 10-20.

17. The method of claim 15, wherein the removing the silicon dioxide layer comprises one of chemical mechanical polishing or plasma dry etching with a selection ratio of silicon dioxide to silicon of 5.

18. The method of claim 12, wherein the removing the remaining second substrate part to expose the stop layer comprises one of chemical mechanical polishing, wet etching, or plasma dry etching.

19. The method of claim 18, wherein the one of chemical mechanical polishing, wet etching, or plasma dry etching is performed with a selection ratio of silicon to silicon nitride is 20-80.

20. The method of claim 12, wherein the removing the stop layer to expose the first substrate part comprises removing the silicon nitride layer by one of chemical mechanical polishing or plasma dry etching.

21. The method of claim 12, wherein a depth between the stop layer structure and the active surface is 1 micron-5 microns.

22. The method of claim 12, wherein the thickness of the silicon nitride layer is about 500 nanometers.

23. A method for manufacturing a stack structure, comprising:
manufacturing a plurality of wafers, the manufacturing of each of the plurality wafers comprising:
providing a substrate having an active surface and a backside;
implanting nitrogen ions to form a first layer at a first depth from the active surface;
implanting oxygen ions at a second depth from the active surface of the wafer, the first depth being greater than the second depth;
performing a high temperature treatment to form a silicon nitride layer and a silicon dioxide layer to form a stop layer comprising the silicon nitride layer and the silicon dioxide layer, the stop layer dividing the substrate into a first substrate part at a side of the active surface and a second substrate part at a side of the backside;
on a first wafer of the plurality of wafers:
removing the second substrate part to expose the stop layer;
removing the stop layer to expose the first substrate part;
bonding a second wafer of the plurality of wafers on the first wafer with first substrate part of the second wafer facing a surface of the first wafer that is exposed by removing the stop layer and, on the second wafer, performing the same processes of removing the second substrate part to expose the stop layer and removing the stop layer of the second wafer to expose the first substrate part;
repeating the bonding and removing the second substrate part and the stop layer with one or more wafers to form a stack of bonded and thinned wafers.

24. The method of claim 23, wherein the removing the stop layer to expose the first substrate part comprises removing the silicon nitride layer and the silicon dioxide layer in sequence.

25. The method of claim 23, wherein the removing the second substrate part to expose the stop layer comprises:
grinding the backside to remove a portion of the second substrate part at the backside; and
removing the remaining second substrate part by one of chemical mechanical polishing, wet etching, or plasma dry etching.

* * * * *